(12) United States Patent
Melanson

(10) Patent No.: US 8,120,341 B2
(45) Date of Patent: Feb. 21, 2012

(54) SWITCHING POWER CONVERTER WITH SWITCH CONTROL PULSE WIDTH VARIABILITY AT LOW POWER DEMAND LEVELS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 806 days.

(21) Appl. No.: 12/114,130

(22) Filed: May 2, 2008

(65) Prior Publication Data

US 2008/0272758 A1 Nov. 6, 2008

Related U.S. Application Data

(60) Provisional application No. 60/915,547, filed on May 2, 2007.

(51) Int. Cl.
*G05F 1/40* (2006.01)
(52) U.S. Cl. ....................................... 323/282
(58) Field of Classification Search .......... 323/282–285, 323/288, 351
See application file for complete search history.

(56) References Cited

U.S. PATENT DOCUMENTS

| | | |
|---|---|---|
| 3,316,495 A | 4/1967 | Sherer |
| 3,423,689 A | 1/1969 | Miller et al. |
| 3,586,988 A | 6/1971 | Weekes |
| 3,725,804 A | 4/1973 | Langan |
| 3,790,878 A | 2/1974 | Brokaw |
| 3,881,167 A | 4/1975 | Pelton et al. |
| 4,075,701 A | 2/1978 | Hofmann |
| 4,334,250 A | 6/1982 | Theus |
| 4,409,476 A | 10/1983 | Lofgren et al. |
| 4,414,493 A | 11/1983 | Henrich |
| 4,476,706 A | 10/1984 | Hadden et al. |
| 4,523,128 A | 6/1985 | Stamm |

(Continued)

FOREIGN PATENT DOCUMENTS

DE 19713814 10/1998

(Continued)

OTHER PUBLICATIONS

Bourgeois, J.M., PWM Technique for Acoustic Noise Reduction in Power Applications, Institute of Electrical and Electronics Engineers, Proceedings of the Annual Applied Power Electronics Conference and Exposition, San Diego, Mar. 7-11, 1993, pp. 141-145.

(Continued)

*Primary Examiner* — Adolf Berhane
(74) *Attorney, Agent, or Firm* — Hamilton & Terrile, LLP; Kent B. Chambers

(57) ABSTRACT

A power control system includes a switch mode controller to control the switching mode of a switching power converter. The switch mode controller generates a switch control signal that controls conductivity of a switch of the switching power converter. Controlling conductivity of the switch controls the switch mode of the switching power converter. The switch mode controller includes a period generator to determine a period of the switch control signal and to vary the determined period to generate a broad frequency spectrum of the switch control signal when the determined period corresponds with a frequency in at least a portion of an audible frequency band. Generating a switch control signal with a broad frequency spectrum in the audible frequency band allows the system to utilize switching frequencies in the audible frequency band.

33 Claims, 16 Drawing Sheets

U.S. PATENT DOCUMENTS

| | | |
|---|---|---|
| 4,677,366 A | 6/1987 | Wilkinson et al. |
| 4,683,529 A | 7/1987 | Bucher |
| 4,700,188 A | 10/1987 | James |
| 4,737,658 A | 4/1988 | Kronmuller et al. |
| 4,797,633 A | 1/1989 | Humphrey |
| 4,937,728 A | 6/1990 | Leonardi |
| 4,940,929 A | 7/1990 | Williams |
| 4,973,919 A | 11/1990 | Allfather |
| 4,979,087 A | 12/1990 | Sellwood et al. |
| 4,980,898 A | 12/1990 | Silvian |
| 4,992,919 A | 2/1991 | Lee et al. |
| 4,994,952 A | 2/1991 | Silva et al. |
| 5,001,620 A | 3/1991 | Smith |
| 5,055,746 A | 10/1991 | Hu et al. |
| 5,109,185 A | 4/1992 | Ball |
| 5,121,079 A | 6/1992 | Dargatz |
| 5,206,540 A | 4/1993 | de Sa e Silva et al. |
| 5,264,780 A | 11/1993 | Bruer et al. |
| 5,278,490 A | 1/1994 | Smedley |
| 5,323,157 A | 6/1994 | Ledzius et al. |
| 5,359,180 A | 10/1994 | Park et al. |
| 5,383,109 A | 1/1995 | Maksimovic et al. |
| 5,424,932 A | 6/1995 | Inou et al. |
| 5,477,481 A | 12/1995 | Kerth |
| 5,479,333 A | 12/1995 | McCambridge et al. |
| 5,481,178 A | 1/1996 | Wilcox et al. |
| 5,565,761 A | 10/1996 | Hwang |
| 5,589,759 A | 12/1996 | Borgato et al. |
| 5,638,265 A | 6/1997 | Gabor |
| 5,691,890 A | 11/1997 | Hyde |
| 5,747,977 A | 5/1998 | Hwang |
| 5,757,635 A | 5/1998 | Seong |
| 5,764,039 A | 6/1998 | Choi et al. |
| 5,768,111 A | 6/1998 | Zaitsu |
| 5,781,040 A | 7/1998 | Myers |
| 5,783,909 A | 7/1998 | Hochstein |
| 5,798,635 A | 8/1998 | Hwang et al. |
| 5,900,683 A | 5/1999 | Rinehart et al. |
| 5,912,812 A | 6/1999 | Moriarty, Jr. |
| 5,929,400 A | 7/1999 | Colby et al. |
| 5,946,202 A | 8/1999 | Balogh |
| 5,946,206 A | 8/1999 | Shimizu et al. |
| 5,952,849 A | 9/1999 | Haigh et al. |
| 5,960,207 A | 9/1999 | Brown |
| 5,962,989 A | 10/1999 | Baker |
| 5,963,086 A | 10/1999 | Hall |
| 5,966,297 A | 10/1999 | Minegishi |
| 5,994,885 A | 11/1999 | Wilcox et al. |
| 6,016,038 A | 1/2000 | Mueller et al. |
| 6,043,633 A | 3/2000 | Lev et al. |
| 6,072,969 A | 6/2000 | Yokomori et al. |
| 6,083,276 A | 7/2000 | Davidson et al. |
| 6,084,450 A | 7/2000 | Smith et al. |
| 6,091,233 A | 7/2000 | Hwang |
| 6,125,046 A | 9/2000 | Jang et al. |
| 6,150,774 A | 11/2000 | Mueller et al. |
| 6,181,114 B1 | 1/2001 | Hemena et al. |
| 6,211,626 B1 | 4/2001 | Lys et al. |
| 6,211,627 B1 | 4/2001 | Callahan |
| 6,229,271 B1 | 5/2001 | Liu |
| 6,229,292 B1 | 5/2001 | Redl et al. |
| 6,246,183 B1 | 6/2001 | Buonavita |
| 6,259,614 B1 | 7/2001 | Ribarich et al. |
| 6,300,723 B1 | 10/2001 | Wang et al. |
| 6,304,066 B1 | 10/2001 | Wilcox et al. |
| 6,304,473 B1 | 10/2001 | Telefus et al. |
| 6,343,026 B1 | 1/2002 | Perry |
| 6,344,811 B1 | 2/2002 | Melanson |
| 6,369,525 B1 | 4/2002 | Chang et al. |
| 6,385,063 B1 | 5/2002 | Sadek et al. |
| 6,407,514 B1 | 6/2002 | Glaser et al. |
| 6,407,515 B1 | 6/2002 | Hesler |
| 6,407,691 B1 | 6/2002 | Yu |
| 6,441,558 B1 | 8/2002 | Muthu et al. |
| 6,445,600 B2 | 9/2002 | Ben-Yaakov |
| 6,452,521 B1 | 9/2002 | Wang |
| 6,469,484 B2 | 10/2002 | L'Hermite et al. |
| 6,495,964 B1 | 12/2002 | Muthu et al. |
| 6,509,913 B2 | 1/2003 | Martin, Jr. et al. |
| 6,531,854 B2 | 3/2003 | Hwang |
| 6,580,258 B2 | 6/2003 | Wilcox et al. |
| 6,583,550 B2 | 6/2003 | Iwasa et al. |
| 6,628,106 B1 | 9/2003 | Batarseh et al. |
| 6,636,003 B2 | 10/2003 | Rahm et al. |
| 6,646,848 B2 | 11/2003 | Yoshida et al. |
| 6,657,417 B1 | 12/2003 | Hwang |
| 6,688,753 B2 | 2/2004 | Calon et al. |
| 6,713,974 B2 | 3/2004 | Patchornik et al. |
| 6,724,174 B1 | 4/2004 | Esteves et al. |
| 6,727,832 B1 | 4/2004 | Melanson |
| 6,737,845 B2 | 5/2004 | Hwang |
| 6,741,123 B1 | 5/2004 | Andersen et al. |
| 6,753,661 B2 | 6/2004 | Muthu et al. |
| 6,756,772 B2 | 6/2004 | McGinnis |
| 6,768,655 B1 | 7/2004 | Yang et al. |
| 6,781,351 B2 | 8/2004 | Mednik et al. |
| 6,788,011 B2 | 9/2004 | Mueller et al. |
| 6,806,659 B1 | 10/2004 | Mueller et al. |
| 6,839,247 B1 | 1/2005 | Yang |
| 6,860,628 B2 | 3/2005 | Robertson et al. |
| 6,870,325 B2 | 3/2005 | Bushell et al. |
| 6,873,065 B2 | 3/2005 | Haigh et al. |
| 6,882,552 B2 | 4/2005 | Telefus et al. |
| 6,888,322 B2 | 5/2005 | Dowling et al. |
| 6,894,471 B2 | 5/2005 | Corva et al. |
| 6,933,706 B2 | 8/2005 | Shih |
| 6,940,733 B2 | 9/2005 | Schie et al. |
| 6,944,034 B1 | 9/2005 | Shteynberg et al. |
| 6,956,750 B1 | 10/2005 | Eason et al. |
| 6,958,920 B2 | 10/2005 | Mednik et al. |
| 6,963,496 B2 | 11/2005 | Bimbaud |
| 6,967,448 B2 | 11/2005 | Morgan et al. |
| 6,970,503 B1 | 11/2005 | Kalb |
| 6,975,079 B2 | 12/2005 | Lys et al. |
| 6,975,523 B2 | 12/2005 | Kim et al. |
| 6,980,446 B2 | 12/2005 | Simada et al. |
| 7,003,023 B2 | 2/2006 | Krone et al. |
| 7,034,611 B2 | 4/2006 | Oswal et al. |
| 7,050,509 B2 | 5/2006 | Krone et al. |
| 7,064,498 B2 | 6/2006 | Dowling et al. |
| 7,064,531 B1 | 6/2006 | Zinn |
| 7,072,191 B2 | 7/2006 | Nakao et al. |
| 7,075,329 B2 | 7/2006 | Chen et al. |
| 7,078,963 B1 | 7/2006 | Andersen et al. |
| 7,088,059 B2 | 8/2006 | McKinney et al. |
| 7,099,163 B1 | 8/2006 | Ying |
| 7,102,902 B1 | 9/2006 | Brown et al. |
| 7,106,603 B1 | 9/2006 | Lin et al. |
| 7,109,791 B1 | 9/2006 | Epperson et al. |
| 7,126,288 B2 | 10/2006 | Ribarich et al. |
| 7,135,824 B2 | 11/2006 | Lys et al. |
| 7,145,295 B1 | 12/2006 | Lee et al. |
| 7,158,633 B1 | 1/2007 | Hein |
| 7,161,816 B2 | 1/2007 | Shteynberg et al. |
| 7,180,250 B1 | 2/2007 | Gannon |
| 7,183,957 B1 | 2/2007 | Melanson |
| 7,221,130 B2 | 5/2007 | Ribeiro et al. |
| 7,233,135 B2 | 6/2007 | Noma et al. |
| 7,246,919 B2 | 7/2007 | Porchia et al. |
| 7,255,457 B2 | 8/2007 | Ducharm et al. |
| 7,266,001 B1 | 9/2007 | Notohamiprodjo et al. |
| 7,276,861 B1 | 10/2007 | Shteynberg et al. |
| 7,288,902 B1 | 10/2007 | Melanson |
| 7,292,013 B1 | 11/2007 | Chen et al. |
| 7,310,244 B2 | 12/2007 | Yang et al. |
| 7,345,458 B2 | 3/2008 | Kanai et al. |
| 7,375,476 B2 | 5/2008 | Walter et al. |
| 7,388,764 B2 | 6/2008 | Huynh et al. |
| 7,394,210 B2 | 7/2008 | Ashdown |
| 7,511,437 B2 | 3/2009 | Lys et al. |
| 7,538,499 B2 | 5/2009 | Ashdown |
| 7,545,130 B2 | 6/2009 | Latham |
| 7,554,473 B2 | 6/2009 | Melanson |
| 7,569,996 B2 | 8/2009 | Holmes et al. |
| 7,583,136 B2 | 9/2009 | Pelly |
| 7,656,103 B2 | 2/2010 | Shteynberg et al. |
| 7,667,986 B2 | 2/2010 | Artusi et al. |

| | | |
|---|---|---|
| 7,710,047 B2 | 5/2010 | Shteynberg et al. |
| 7,719,246 B2 * | 5/2010 | Melanson ............ 323/282 |
| 7,719,248 B1 | 5/2010 | Melanson |
| 7,746,043 B2 | 6/2010 | Melanson |
| 7,746,671 B2 | 6/2010 | Radecker et al. |
| 7,750,738 B2 | 7/2010 | Bach |
| 7,756,896 B1 | 7/2010 | Feingold |
| 7,777,563 B2 * | 8/2010 | Midya et al. ............ 330/10 |
| 7,804,256 B2 | 9/2010 | Melanson |
| 7,804,480 B2 | 9/2010 | Jeon et al. |
| 2002/0065583 A1 | 5/2002 | Okada |
| 2002/0145041 A1 | 10/2002 | Muthu et al. |
| 2002/0150151 A1 | 10/2002 | Krone et al. |
| 2002/0166073 A1 | 11/2002 | Nguyen et al. |
| 2003/0095013 A1 | 5/2003 | Melanson et al. |
| 2003/0174520 A1 | 9/2003 | Bimbaud |
| 2003/0223255 A1 | 12/2003 | Ben-Yaakov |
| 2004/0004465 A1 | 1/2004 | McGinnis |
| 2004/0046683 A1 | 3/2004 | Mitamura et al. |
| 2004/0085030 A1 | 5/2004 | Laflamme et al. |
| 2004/0085117 A1 | 5/2004 | Melbert et al. |
| 2004/0169477 A1 | 9/2004 | Yancie et al. |
| 2004/0227571 A1 | 11/2004 | Kuribayashi |
| 2004/0228116 A1 | 11/2004 | Miller et al. |
| 2004/0232971 A1 | 11/2004 | Kawasake et al. |
| 2004/0239262 A1 | 12/2004 | Ido et al. |
| 2005/0057237 A1 | 3/2005 | Clavel |
| 2005/0156770 A1 | 7/2005 | Melanson |
| 2005/0168492 A1 | 8/2005 | Hekstra et al. |
| 2005/0184895 A1 | 8/2005 | Petersen et al. |
| 2005/0197952 A1 | 9/2005 | Shea et al. |
| 2005/0206361 A1 | 9/2005 | Ito |
| 2005/0207190 A1 | 9/2005 | Gritter |
| 2005/0218838 A1 | 10/2005 | Lys |
| 2005/0222881 A1 | 10/2005 | Booker |
| 2005/0253533 A1 | 11/2005 | Lys et al. |
| 2005/0270813 A1 | 12/2005 | Zhang et al. |
| 2005/0275354 A1 | 12/2005 | Hausman, Jr. et al. |
| 2005/0275386 A1 | 12/2005 | Jepsen et al. |
| 2006/0002110 A1 | 1/2006 | Dowling |
| 2006/0022916 A1 | 2/2006 | Aiello |
| 2006/0023002 A1 | 2/2006 | Hara et al. |
| 2006/0116898 A1 | 6/2006 | Peterson |
| 2006/0125420 A1 | 6/2006 | Boone et al. |
| 2006/0184414 A1 | 8/2006 | Pappas et al. |
| 2006/0214603 A1 | 9/2006 | Oh et al. |
| 2006/0221646 A1 | 10/2006 | Ye et al. |
| 2006/0226795 A1 | 10/2006 | Walter et al. |
| 2006/0238136 A1 | 10/2006 | Johnson III et al. |
| 2006/0261754 A1 | 11/2006 | Lee |
| 2006/0285365 A1 | 12/2006 | Huynh et al. |
| 2007/0024213 A1 | 2/2007 | Shteynberg et al. |
| 2007/0029946 A1 | 2/2007 | Yu et al. |
| 2007/0040512 A1 | 2/2007 | Jungwirth et al. |
| 2007/0053182 A1 | 3/2007 | Robertson |
| 2007/0055564 A1 | 3/2007 | Fourman |
| 2007/0103949 A1 | 5/2007 | Tsuruya |
| 2007/0124615 A1 | 5/2007 | Orr |
| 2007/0126656 A1 | 6/2007 | Huang et al. |
| 2007/0182699 A1 | 8/2007 | Ha et al. |
| 2007/0285031 A1 | 12/2007 | Shteynberg et al. |
| 2008/0012502 A1 | 1/2008 | Lys |
| 2008/0027841 A1 | 1/2008 | Eder |
| 2008/0043504 A1 | 2/2008 | Ye et al. |
| 2008/0054815 A1 | 3/2008 | Kotikalapoodi et al. |
| 2008/0116818 A1 | 5/2008 | Shteynberg et al. |
| 2008/0130322 A1 | 6/2008 | Artusi et al. |
| 2008/0130336 A1 | 6/2008 | Taguchi |
| 2008/0150433 A1 | 6/2008 | Tsuchida et al. |
| 2008/0154679 A1 | 6/2008 | Wade |
| 2008/0174291 A1 | 7/2008 | Hansson et al. |
| 2008/0174372 A1 | 7/2008 | Tucker et al. |
| 2008/0175029 A1 | 7/2008 | Jung et al. |
| 2008/0192509 A1 | 8/2008 | Dhuyvetter et al. |
| 2008/0224635 A1 | 9/2008 | Hayes |
| 2008/0232141 A1 | 9/2008 | Artusi et al. |
| 2008/0239764 A1 | 10/2008 | Jacques et al. |
| 2008/0259655 A1 | 10/2008 | Wei et al. |
| 2008/0278132 A1 | 11/2008 | Kesterson et al. |
| 2009/0067204 A1 | 3/2009 | Ye et al. |
| 2009/0070188 A1 | 3/2009 | Scott et al. |
| 2009/0147544 A1 | 6/2009 | Melanson |
| 2009/0174479 A1 | 7/2009 | Yan et al. |
| 2009/0218960 A1 | 9/2009 | Lyons et al. |
| 2010/0141317 A1 * | 6/2010 | Szajnowski ............ 327/160 |

FOREIGN PATENT DOCUMENTS

| | | |
|---|---|---|
| DE | 10212605 A1 | 10/2003 |
| EP | 0585789 A1 | 3/1994 |
| EP | 0632679 | 1/1995 |
| EP | 0838791 | 4/1998 |
| EP | 0910168 A1 | 4/1999 |
| EP | 1014563 | 6/2000 |
| EP | 1164819 A | 12/2001 |
| EP | 1213823 A2 | 6/2002 |
| EP | 1460775 | 9/2004 |
| EP | 1528785 A | 5/2005 |
| EP | 2204905 A1 | 7/2010 |
| GB | 2069269 A | 8/1981 |
| WO | W09725836 | 7/1997 |
| WO | 01/15316 A1 | 1/2001 |
| WO | 01/97384 A | 12/2001 |
| WO | 02/15386 A2 | 2/2002 |
| WO | WO0227944 | 4/2002 |
| WO | 02/091805 A2 | 11/2002 |
| WO | WO2006013557 | 2/2006 |
| WO | WO 2006/022107 A2 | 3/2006 |
| WO | 2006/067521 A | 6/2006 |
| WO | WO2006135584 | 12/2006 |
| WO | 2007/026170 A | 3/2007 |
| WO | 2007/079362 A | 7/2007 |
| WO | WO2008072160 | 6/2008 |
| WO | WO2008152838 | 12/2008 |

OTHER PUBLICATIONS

Hirota, A. et al., Analysis of Single Switch Delta-Sigma Modulated Pulse Space Modulation PFC Converter Effectively Using Switching Power Device, 33rd Annual IEEE Power Electronics Specialists Conference, Conference Proceedings, Cairns, Queensland, Australia, Jun. 23-27, 2002, pp. 682-686.

International Search Report and Written Opinion for PCT/US2008/062423, dated Aug. 11, 2008.

Freescale Semiconductor, Inc., Dimmable Light Ballast with Power Factor Correction, Design Reference Manual, DRM067, Rev. 1, Dec. 2005.

J. Zhou et al., Novel Sampling Algorithm for DSP Controlled 2 kW PFC Converter, IEEE Transactions on Power Electronics, vol. 16, No. 2, Mar. 2001.

A. Prodic, Compensator Design and Stability Assessment for Fast Voltage Loops of Power Factor Correction Rectifiers, IEEE Transactions on Power Electronics, vol. 22, No. 5, Sep. 2007.

M. Brkovic et al., "Automatic Current Shaper with Fast Output Regulation and Soft-Switching," S.15.C Power Converters, Telecommunications Energy Conference, 1993.

Dallas Semiconductor, Maxim, "Charge-Pump and Step-Up DC-DC Converter Solutions for Powering White LEDs in Series or Parallel Connections," Apr. 23, 2002.

Freescale Semiconductor, AN3052, Implementing PFC Average Current Mode Control Using the MC9S12E128, Nov. 2005.

D. Maksimovic et al., "Switching Converters with Wide DC Conversion Range," Institute of Electrical and Electronic Engineer's (IEEE) Transactions on Power Electronics, Jan. 1991.

V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.

S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.

K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.

K. Leung et al., "Dynamic Hysteresis Band Control of the Buck Converter with Fast Transient Response," IEEE Transactions on Circuits and Systems—II: Express Briefs, vol. 52, No. 7, Jul. 2005.

Y. Ohno, Spectral Design Considerations for White LED Color Rendering, Final Manuscript, Optical Engineering, vol. 44, 111302 (2005).

S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.

J. Turchi, Four Key Steps to Design a Continuous Conduction Mode PFC Stage Using the NCP1653, on Semiconductor, Publication Order No. AND184/D, Nov. 2004.

Megaman, D or S Dimming ESL, Product News, Mar. 15, 2007.

J. Qian et al., New Charge Pump Power-Factor-Correction Electronic Ballast with a Wide Range of Line Input Voltage, IEEE Transactions on Power Electronics, vol. 14, No. 1, Jan. 1999.

P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.

J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.Irc.rpi.edu/programs/solidstate/completedProjects.asp?ID=76, printed May 3, 2007.

S. Chan et al., Design and Implementation of Dimmable Electronic Ballast Based on Integrated Inductor, IEEE Transactions on Power Electronics, vol. 22, No. 1, Jan. 2007.

M. Madigan et al., Integrated High-Quality Rectifier-Regulators, IEEE Transactions on Industrial Electronics, vol. 46, No. 4, Aug. 1999.

T. Wu et al., Single-Stage Electronic Ballast with Dimming Feature and Unity Power Factor, IEEE Transactions on Power Electronics, vol. 13, No. 3, May 1998.

F. Tao et al., "Single-Stage Power-Factor-Correction Electronic Ballast with a Wide Continuous Dimming Control for Fluorescent Lamps," IEEE Power Electronics Specialists Conference, vol. 2, 2001.

Azoteq, IQS17 Family, IQ Switch® - ProxSense™ Series, Touch Sensor, Load Control and User Interface, IQS17 Datasheet V2.00.doc, Jan. 2007.

C. Dilouie, Introducing the LED Driver, EC&M, Sep. 2004.

S. Lee et al., TRIAC Dimmable Ballast with Power Equalization, IEEE Transactions on Power Electronics, vol. 20, No. 6, Nov. 2005.

L. Gonthier et al., EN55015 Compliant 500W Dimmer with Low-Losses Symmetrical Switches, 2005 European Conference on Power Electronics and Applications, Sep. 2005.

Why Different Dimming Ranges? The Difference Between Measured and Perceived Light, 2000 http://www.lutron.com/ballast/pdf/LutronBallastpg3.pdf.

D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.

Light Dimmer Circuits, www.epanorama.net/documents/lights/lightdimmer.html, printed Mar. 26, 2007.

Light Emitting Diode, http://en.wikipedia.org/wiki/Light-emitting_diode, printed Mar. 27, 2007.

Color Temperature, www.sizes.com/units/color_temperature.htm, printed Mar. 27, 2007.

S. Lee et al., A Novel Electrode Power Profiler for Dimmable Ballasts Using DC Link Voltage and Switching Frequency Controls, IEEE Transactions on Power Electronics, vol. 19, No. 3, May 2004.

Y. Ji et al., Compatibility Testing of Fluorescent Lamp and Ballast Systems, IEEE Transactions on Industry Applications, vol. 35, No. 6, Nov./Dec. 1999.

National Lighting Product Information Program, Specifier Reports, "Dimming Electronic Ballasts," vol. 7, No. 3, Oct. 1999.

Supertex Inc., Buck-based LED Drivers Using the HV9910B, Application Note AN-H48, Dec. 28, 2007.

D. Rand et al., Issues, Models and Solutions for Triac Modulated Phase Dimming of LED Lamps, Power Electronics Specialists Conference, 2007.

Supertex Inc., HV9931 Unity Power Factor LED Lamp Driver, Application Note AN-H52, Mar. 7, 2007.

Supertex Inc., 56W Off-line LED Driver, 120VAC with PFC, 160V, 350mA Load, Dimmer Switch Compatible, DN-H05, Feb. 2007.

ST Microelectronics, Power Factor Corrector L6561, Jun. 2004.

Fairchild Semiconductor, Application Note 42047 Power Factor Correction (PFC) Basics, Rev. 0.9.0 Aug. 19, 2004.

M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.

M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

International Search Report for PCT/US2008/051072, mailed Jun. 4, 2008.

Power Integrations, Inc., "TOP200-4/14 TOPSwitch Family Three-terminal Off-line PWM Switch", XP-002524650, Jul. 1996, Sunnyvale, California.

Texas Instruments, SLOS318F, "High-Speed, Low Noise, Fully-Differential I/O Amplifiers," THS4130 and THS4131, US, Jan. 2006.

International Search Report and Written Opinion, PCT US20080062387, dated Feb. 5, 2008.

International Search Report and Written Opinion, PCT US200900032358, dated Jan. 29, 2009.

Hirota, Atsushi et al, "Analysis of Single Switch Delta-Sigma Modulated Pulse Space Modulation PFC Converter Effectively Using Switching Power Device," IEEE, US, 2002.

Prodic, Aleksandar, "Digital Controller for High-Frequency Rectifiers with Power Factor Correction Suitable for On-Chip Implementation," IEEE, US, 2007.

International Search Report and Written Opinion, PCT US20080062378, dated Feb. 5, 2008.

International Search Report and Written Opinion, PCT US20090032351, dated Jan. 29, 2009.

Erickson, Robert W. et al, "Fundamentals of Power Electronics," Second Edition, Chapter 6, Boulder, CO, 2001.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Texas Instruments, SLUS828B, "8-Pin Continuous Conduction Mode (CCM) PFC Controller", UCC28019A, US, revised Apr. 2009.

Analog Devices, "120 kHz Bandwidth, Low Distortion, Isolation Amplifier", AD215, Norwood, MA, 1996.

Burr-Brown, ISO120 and ISO121, "Precision Los Cost Isolation Amplifier," Tucson AZ, Mar. 1992.

Burr-Brown, ISO130, "High IMR, Low Cost Isolation Amplifier," SBOS220, US, Oct. 2001.

International Search Report and Written Report PCT US20080062428 dated Feb. 5, 2008.

Prodic, A. et al, "Dead Zone Digital Controller for Improved Dynamic Response of Power Factor Preregulators," IEEE, 2003.

Linear Technology, "Single Switch PWM Controller with Auxiliary Boost Converter," LT1950 Datasheet, Linear Technology, Inc. Milpitas, CA, 2003.

Yu, Zhenyu, 3.3V DSP for Digital Motor Control, Texas Instruments, Application Report SPRA550 dated Jun. 1999.

International Rectifier, Data Sheet No. PD60143-O, Current Sensing Single Channel Driver, El Segundo, CA, dated Sep. 8, 2004.

Balogh, Laszlo, "Design and Application Guide for High Speed MOSFET Gate Drive Circuits" [Online] 2001, Texas Instruments, Inc., SEM-1400, Unitrode Power Supply Design Seminar, Topic II, TI literature No. SLUP133, XP002552367, Retrieved from the Internet: URL:htt(://focus.ti.com/lit/ml/slup169/slup169.pdf the whole document.

PCT US2008/062423 Notification of International Preliminary Report on Patentability and Written Opinion dated Nov. 12, 2009.

ST Datasheet L6562, Transition-Mode PFC Controller, 2005, STMicroelectronics, Geneva, Switzerland.

Maksimovic, Regan Zane and Robert Erickson, Impact of Digital Control in Power Electronics, Proceedings of 2004 International Symposium on Power Semiconductor Devices & Ics, Kitakyushu, , Apr. 5, 2010, Colorado Power Electronics Center, ECE Department, University of Colorado, Boulder, CO.

Texas Instruments, Interleaving Continuous Conduction Mode PFC Controller, UCC28070, SLUS794C, Nov. 2007, revised Jun. 2009, Texas Instruments, Dallas TX.

Infineon, CCM-PFC Standalone Power Factor Correction (PFC) Controller in Continuous Conduction Mode (CCM), Version 2.1, Feb. 6, 2007.

International Rectifier, IRAC1150-300W Demo Board, User's Guide, Rev 3.0, Aug. 2, 2005.

International Rectifier, Application Note AN-1077,PFC Converter Design with IR1150 One Cycle Control IC, rev. 2.3, Jun. 2005.

International Rectifier, Data Sheet PD60230 revC, Feb. 5, 2007.

Lu et al., International Rectifier, Bridgeless PFC Implementation Using One Cycle Control Technique, 2005.

Linear Technology, LT1248, Power Factor Controller, Apr. 20, 2007.

On Semiconductor, AND8123/D, Power Factor Correction Stages Operating in Critical Conduction Mode, Sep. 2003.

On Semiconductor, MC33260, GreenLine Compact Power Factor Controller: Innovative Circuit for Cost Effective Solutions, Sep. 2005.

On Semiconductor, NCP1605, Enhanced, High Voltage and Efficient Standby Mode, Power Factor Controller, Feb. 2007.

On Semconductor, NCP1606, Cost Effective Power Factor Controller, Mar. 2007.

On Semiconductor, NCP1654, Product Review, Power Factor Controller for Compact and Robust, Continuous Conduction Mode Pre-Converters, Mar. 2007.

Philips, Application Note, 90W Resonant SMPS with TEA1610 SwingChip, AN99011, 1999.

NXP, TEA1750, GreenChip III SMPS control IC Product Data Sheet, Apr. 6, 2007.

Renesas, HA16174P/FP, Power Factor Correction Controller IC, Jan. 6, 2006.

Renesas Technology Releases Industry's First Critical-Conduction-Mode Power Factor Correction Control IC Implementing Interleaved Operation, Dec. 18, 2006.

Renesas, Application Note R2A20111 EVB, PFC Control IC R2A20111 Evaluation Board, Feb. 2007.

Stmicroelectronics, L6563, Advanced Transition-Mode PFC Controller, Mar. 2007.

Texas Instruments, Application Note SLUA321, Startup Current Transient of the Leading Edge Triggered PFC Controllers, Jul. 2004.

Texas Instruments, Application Report, SLUA309A, Avoiding Audible Noise at Light Loads when using Leading Edge Triggered PFC Converters, Sep. 2004.

Texas Instruments, Application Report SLUA369B, 350-W, Two-Phase Interleaved PFC Pre-Regulator Design Review, Mar. 2007.

Unitrode, High Power-Factor Preregulator, Oct. 1994.

Texas Instruments, Transition Mode PFC Controller, SLUS515D, Jul. 2005.

Unitrode Products From Texas Instruments, Programmable Output Power Factor Preregulator, Dec. 2004.

Unitrode Products From Texas Instruments, High Performance Power Factor Preregulator, Oct. 2005.

Texas Instruments, UCC3817 BiCMOS Power Factor Preregulator Evaluation Board User's Guide, Nov. 2002.

Unitrode, L. Balogh, Design Note UC3854A/B and UC3855A/B Provide Power Limiting with Sinusoidal Input Current for PFC Front Ends, SLUA196A, Nov. 2001.

A. Silva De Morais et al., A High Power Factor Ballast Using a Single Switch with Both Power Stages Integrated, IEEE Transactions on Power Electronics, vol. 21, No. 2, Mar. 2006.

M. Ponce et al., High-Efficient Integrated Electronic Ballast for Compact Fluorescent Lamps, IEEE Transactions on Power Electronics, vol. 21, No. 2, Mar. 2006.

A. R. Seidel et al., A Practical Comparison Among High-Power-Factor Electronic Ballasts with Similar Ideas, IEEE Transactions on Industry Applications, vol. 41, No. 6, Nov.-Dec. 2005.

F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.

J. A. Vilela Jr. et al., An Electronic Ballast with High Power Factor and Low Voltage Stress, IEEE Transactions on Industry Applications, vol. 41, No. 4, Jul./Aug. 2005.

S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.

M. K. Kazimierczuk et al., Electronic Ballast for Fluorescent Lamps, IEEETransactions on Power Electronics, vol. 8, No. 4, Oct. 1993.

S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.

H. L. Cheng et al., A Novel Single-Stage High-Power-Factor Electronic Ballast with Symmetrical Topology, IEEE Transactions on Power Electronics, vol. 50, No. 4, Aug. 2003.

J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.

Q. Li et al., An Analysis of the ZVS Two-Inductor Boost Converter under Variable Frequency Operation, IEEE Transactions on Power Electronics, vol. 22, No. 1, Jan. 2007.

H. Peng et al., Modeling of Quantization Effects in Digitally Controlled DC-DC Converters, IEEE Transactions on Power Electronics, vol. 22, No. 1, Jan. 2007.

G. Yao et al., Soft Switching Circuit for Interleaved Boost Converters, IEEE Transactions on Power Electronics, vol. 22, No. 1, Jan. 2007.

C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.

W. Zhang et al., A New Duty Cycle Control Strategy for Power Factor Correction and FPGA Implementation, IEEE Transactions on Power Electronics, vol. 21, No. 6, Nov. 2006.

H. Wu et al., Single Phase Three-Level Power Factor Correction Circuit with Passive Lossless Snubber, IEEE Transactions on Power Electronics, vol. 17, No. 2, Mar. 2006.

O. Garcia et al., High Efficiency PFC Converter to Meet EN61000-3-2 and A14, Proceedings of the 2002 IEEE International Symposium on Industrial Electronics, vol. 3, 2002.

P. Lee et al., Steady-State Analysis of an Interleaved Boost Converter with Coupled Inductors, IEEE Transactions on Industrial Electronics, vol. 47, No. 4, Aug. 2000.

D.K.W. Cheng et al., A New Improved Boost Converter with Ripple Free Input Current Using Coupled Inductors, Power Electronics and Variable Speed Drives, Sep. 21-23, 1998.

B.A. Miwa et al., High Efficiency Power Factor Correction Using Interleaved Techniques, Applied Power Electronics Conference and Exposition, Seventh Annual Conference Proceedings, Feb. 23-27,1992.

Z. Lai et al., A Family of Power-Factor-Correction Controllers, Twelfth Annual Applied Power Electronics Conference and Exposition, vol. 1, Feb. 23, 1997-Feb. 27, 1997.

L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.

Fairchild Semiconductor, Application Note 42030, Theory and Application of the ML4821 Average Current Mode PFC Controller, Oct. 25, 2000.

Unitrode Products From Texas Instruments, BiCMOS Power Factor Preregulator, Feb. 2006.

D. Hausman, Lutron, RTISS-TE Operation, Real-Time Illumination Stability Systems for Trailing-Edge (Reverse Phase Control) Dimmers, v. 1.0 Dec. 2004.

International Rectifier, Data Sheet No. PD60230 revC, IR1150(S)(PbF), uPFC One Cycle Control PFC IC Feb. 5, 2007.

Texas Instruments, Application Report SLUA308, UCC3817 Current Sense Transformer Evaluation, Feb. 2004.

Texas Instruments, Application Report SPRA902A, Average Current Mode Controlled Power Factor Correctiom Converter using TMS320LF2407A, Jul. 2005.

Unitrode, Design Note DN-39E, Optimizing Performance in UC3854 Power Factor Correction Applications, Nov. 1994.

Fairchild Semiconductor, Application Note 42030, Theory and Application of the ML4821 Average Currrent Mode PFC Controller, Aug. 1997.

Fairchild Semiconductor, Application Note AN4121, Design of Power Factor Correction Circuit Using FAN7527B, Rev.1.0.1, May 30, 2002.

Fairchild Semiconductor, Application Note 6004, 500W Power-Factor-Corrected (PFC) Converter Design with FAN4810, Rev. 1.0.1, Oct. 31, 2003.

Fairchild Semiconductor, FAN4822, ZVA Average Current PFC Controller, Rev. 1.0.1 Aug. 10, 2001.

Fairchild Semiconductor, ML4821, Power Factor Controller, Rev. 1.0.2, Jun. 19, 2001.

Fairchild Semiconductor, ML4812, Power Factor Controller, Rev. 1.0.4, May 31, 2001.

Linear Technology, 100 Watt LED Driver, Linear Technology, 2006.

Fairchild Semiconductor, FAN7544, Simple Ballast Controller, Rev. 1.0.0, 2004.

Fairchild Semiconductor, FAN7532, Ballast Controller, Rev. 1.0.2, Jun. 2006.

Fairchild Semiconductor, FAN7711, Ballast Control IC, Rev. 1.0.2, Mar. 2007.

Fairchild Semiconductor, KA7541, Simple Ballast Controller, Rev. 1.0.3, 2001.

ST Microelectronics, L6574, CFL/TL Ballast Driver Preheat and Dimming, Sep. 2003.

ST Microelectronics, AN993, Application Note, Electronic Ballast with PFC Using L6574 and L6561, May 2004.

International Search Report and Written Opinion for PCT/US2008/062384 dated Jan. 14, 2008.

S. Dunlap et al., Design of Delta-Sigma Modulated Switching Power Supply, Circuits & Systems, Proceedings of the 1998 IEEE International Symposium, 1998.

Mamano, Bob, "Current Sensing Solutions for Power Supply Designers", Unitrode Seminar Notes SEM1200, 1999.

http://toolbarpdf.com/docs/functions-and-features-of-inverters.html printed on Jan. 20, 2011.

"HV9931 Unity Power Factor LED Lamp Driver, Initial Release", SUPERTEX INC., Sunnyvale, CA USA 2005.

AN-H52 Application Note: "HV9931 Unity Power Factor LED Lamp Driver" Mar. 7, 2007, SUPERTEX INC., Sunnyvale, CA, USA.

Dustin Rand et al: "Issues, Models and Solutions for Triac Modulated Phase Dimming of LED Lamps" Power Electronics Specialists Conference, 2007. PESC 2007. IEEE, IEEE, P1, Jun. 1, 2007, pp. 1398-1404.

Spiazzi G et al: "Analysis of a High-Power Factor Electronic Ballast for High Brightness Light Emitting Diodes" Power Electronics Specialists, 2005 IEEE 36th Conference on Jun. 12, 2005, Piscatawa, NJ, USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.

International Search Report PCT/US2008/062398 dated Feb. 5, 2008.

Partial International Search Report PCT/US2008/062387 dated Feb. 5, 2008.

Noon, Jim "UC3855A/B High Performance Power Factor Preregulator", Texas Instruments, SLUA146A, May, 1996, Revised Apr. 2004.

International Search Report PCT/GB2006/003259 dated Jan. 12, 2007.

Written Opinion of the International Searching Authority PCT/US2008/056739 dated Dec. 3, 2008.

International Search Report PCT/US2008/056606 dated Dec. 3, 2008.

Written Opinion of the International Searching Authority PCT/US2008/056606 dated Dec. 3, 2008.

International Search Report PCT/US2008/056608 dated Dec. 3, 2008.

Written Opinion of the International Searching Authority PCT/US2008/056608 dated Dec. 3, 2008.

International Search Report PCT/GB2005/050228 dated Mar. 14, 2006.

International Search Report PCT/US2008/062387 dated Jan. 10, 2008.

Data Sheet LT3496 Triple Output LED Driver, Linear Technology Corporation, Milpitas, CA 2007.

Linear Technology, News Release,Triple Output LED, LT3496, Linear Technology, Milpitas, CA, May 24, 2007.

* cited by examiner

SWITCHING POWER CONVERTER WITH SWITCH CONTROL PULSE WIDTH VARIABILITY AT LOW POWER DEMAND LEVELS

CROSS-REFERENCE TO RELATED APPLICATION

This application claims the benefit under 35 U.S.C. §119(e) and 37 C.F.R. §1.78 of U.S. Provisional Application No. 60/915,547, filed on May 2, 2007 and entitled "Power Factor Correction (PFC) Controller Apparatuses and Methods".

BACKGROUND OF THE INVENTION

1. Field of the Invention

The present invention relates in general to the field of electronics, and more specifically to a system and method for voltage conversion using a switching power converter with variations of a switch control signal pulse widths at low power demand levels.

2. Description of the Related Art

Many devices utilize electrical power to operate. Power is initially supplied by a power source, such as a public utility company, and power sources generally provide a steady state input voltage. However, the voltage levels utilized by various devices may differ from the steady state input voltage provided by the power source. For example, light emitting diode (LED) based lighting systems, typically operate from voltage levels that differ from voltage level supplied by a public utility company. To accommodate the difference between the voltage from the power source and the voltage utilized by the device, power converters are connected between the power source and the device to convert a supply voltage level from an alternating current (AC) power source to, for example, another AC power source having a voltage level different than the supply voltage level. Power converters can also convert AC power into direct (DC) power and DC power into AC power.

Switching power converters represent one example of a type of power converter. A switching power converter utilizes switching and energy storage technology to convert an input voltage into an output voltage suitable for use by a particular device connected to the switching power converter.

FIG. 1 depicts a power control system 100, which includes a switching power converter 102. Voltage source 101 supplies an AC input "mains" voltage $V_{mains}$ to a full, diode bridge rectifier 103. The voltage source 101 is, for example, a public utility, and the AC mains voltage $V_{mains}$ is, for example, a 60 Hz/120 V mains voltage in the United States of America or a 50 Hz/230 V mains voltage in Europe. The rectifier 103 rectifies the input mains voltage $V_{mains}$. The rectifier 103 rectifies the input mains voltage $V_{mains}$ and supplies a rectified, time-varying, primary supply voltage $V_X$ to the switching power converter. The switching power converter 102 provides approximately constant voltage power to load 112 while maintaining a resistive input characteristic to voltage source 101. Providing approximately constant voltage power to load 112 while maintaining an approximately resistive input characteristic to voltage source 101 is referred to as power factor correction (PFC). Thus, a power factor corrected switching power converter 102 is controlled so that an input current $i_L$ to the switching power converter 102 varies in approximate proportion to the AC mains voltage $V_{mains}$.

PFC and output voltage controller 114 controls the conductivity of switch mode switch 108 so as to provide power factor correction and to regulate the output voltage $V_C$ of switching power converter 102. The PFC and output voltage controller 114 attempts to control the inductor current $i_L$ so that the average inductor current $i_L$ is linearly and directly proportional to the primary supply voltage $V_X$. A proportionality constant relates the inductor current $i_L$ to the primary supply voltage $V_X$, and the proportionality constant is adjusted to regulate the voltage to load 112. The PFC and output voltage controller 114 supplies a pulse width modulated (PWM) switch control signal $CS_0$ to control the conductivity of switch 108. In at least one embodiment, switch 108 is a field effect transistor (FET), and switch control signal $CS_0$ is the gate voltage of switch 108. The values of the pulse width and duty cycle of switch control signal $CS_0$ depend on at least two signals, namely, the primary supply voltage $V_X$ and the capacitor voltage/output voltage $V_C$. Output voltage $V_C$ is also commonly referred to as a "link voltage". Current control loop 119 provides current $i_{RTN}$ to PFC and output voltage controller 114 to allow PFC and output voltage controller 114 to adjust an average $i_L$ current to equal a target $i_L$ current.

Capacitor 106 supplies stored energy to load 112 when diode 111 is reverse biased and when the primary supply voltage $V_X$ is below the RMS value of the input mains. The value of capacitor 106 is a matter of design choice and, in at least one embodiment, is sufficiently large so as to maintain a substantially constant output voltage $V_C$, as established by a PFC and output voltage controller 114. A typical value for capacitor 106, when used with a 400 V output voltage $V_C$, is 1 microfarad per watt of maximum output power supplied via switching power converter 102. The output voltage $V_C$ remains at a substantially constant target value during constant load conditions with ripple at the frequency of primary supply voltage $V_X$. However, as load conditions change, the output voltage $V_C$ changes. The PFC and output voltage controller 114 responds to the changes in voltage $V_C$ by adjusting the switch control signal $CS_0$ to return the output voltage $V_C$ to the target value. In at least one embodiment, the PFC and output voltage controller 114 includes a small capacitor 115 to filter any high frequency signals from the primary supply voltage $V_X$.

The switching power converter 102 incurs switching losses each time switch 108 switches between nonconductive and conductive states due to parasitic impedances. The parasitic impedances include a parasitic capacitance 132 across switch 108. During each period TT of switching switch control signal $CS_0$, energy is used to, for example, charge parasitic capacitance 132. Thus, switching power converter 102 incurs switching losses during each period TT of switch control signal $CS_0$.

PFC and output voltage controller 114 controls the process of switching power converter 102 so that a desired amount of energy is transferred to capacitor 106. The desired amount of energy depends upon the voltage and current requirements of load 112. To determine the amount of energy demand of load 112, the PFC and output voltage controller 114 includes a compensator 128. An input voltage control loop 116 provides a sample of primary supply voltage $V_X$ to PFC and output voltage controller 114. Compensator 128 determines a difference between a reference voltage $V_{REF}$, which indicates a target voltage for output voltage $V_C$, and the actual output voltage $V_C$ sensed from node 122 and received as feedback from voltage loop 118. The compensator 128 generally utilizes technology, such as proportional integral (PI) type control, to respond to differences in the output voltage $V_C$ relative to the reference voltage $V_{REF}$. The PI control processes the error so that the PFC and output voltage controller 114 smoothly adjusts the output voltage $V_C$ to avoid causing rapid fluctuations in the output voltage $V_C$ in response to small error signals. The compensator 128 provides an output signal to the pulse width modulator (PWM) 130 to cause the PWM 130 to generate a switch control signal $CS_0$ that drives switch 108.

PFC and output voltage controller 114 modulates the conductivity of PFC switch 108. The primary supply voltage $V_X$ is, in at least one embodiment, a rectified sine wave. To regulate the amount of energy transferred and maintain a power factor close to one, PFC and output voltage controller 114 varies the period TT of switch control signal $CS_0$ so that the inductor current $i_L$ (also referred to as the 'input current') tracks changes in primary supply voltage $V_X$ and holds the output voltage $V_C$ constant. As the primary supply voltage $V_X$ increases from phase angle 0° to phase angle 90°, PFC and output voltage controller 114 increases the period TT of switch control signal $CS_0$, and as the primary supply voltage $V_X$ decreases, PFC and output voltage controller 114 decreases the period of switch control signal $CS_0$.

Time T2 represents a flyback time of inductor 110 that occurs when switch 108 is nonconductive and the diode 111 is conductive. In at least one embodiment, the value of inductor 110 is a matter of design choice. Inductor 110 can be any type of magnetic component including a transformer. In at least one embodiment, the value of inductor 110 is chosen to store sufficient power transferred from voltage source 101 when switch 108 conducts in order to transfer energy to capacitor 106 when switch 108 is non-conductive to maintain a desired output voltage $V_C$.

The inductor current $i_L$ ramps 'up' during time T1 when the switch 108 conducts, i.e. is "ON". The inductor current $i_L$ ramps down during flyback time T2 when switch 108 is nonconductive, i.e. is "OFF", and supplies inductor current $i_L$ through diode 111 to recharge capacitor 106. Discontinuous conduction mode (DCM) occurs when the inductor current $i_L$ reaches 0 during the period TT of switch control signal $CS_0$. Continuous conduction mode (CCM) occurs when the inductor current $i_L$ is greater than 0 during the entire period TT.

The PFC and output voltage controller 114 sets a target current that tracks the primary supply voltage $V_X$. When the inductor current $i_L$ reaches the target current during the pulse width T1, the switch control signal $CS_0$ opens switch 108, and inductor current $i_L$ decreases to zero during flyback time T2. An average inductor current $i_L$ tracks the primary supply voltage $V_X$, thus, providing power factor correction. Prodić, *Compensator Design and Stability Assessment for Fast Voltage Loops of Power Factor Correction Rectifiers*, IEEE Transactions on Power Electronics, Vol. 12, No. 5, September 1007, pp. 1719-1729 (referred to herein as "Prodić"), describes an example of PFC and output voltage controller 114.

PFC and output voltage controller 114 updates the switch control signal $CS_0$ at a frequency much greater than the frequency of input voltage $V_X$. The frequency of input voltage $V_X$ is generally 50-60 Hz. The frequency 1/TT of switch control signal $CS_0$ is, for example, at or below 130 kHz to avoid significant switching inefficiencies.

FIG. 2 depicts a human audible sensitivity versus audible frequency band graph 200. The audible sensitivity plot 202 indicates the relationship between sound frequencies and human sensitivity to the sounds. References to "humans" refer to typical humans. Generally, humans can hear sounds having frequencies ranging from about 20 Hz to about 20 kHz. Thus, the audible frequency band is defined as approximately 20 Hz to 20 kHz. Human sensitivity to sound increases as the frequency increases from 20 Hz to about 1 kHz. At about 1 kHz, human sensitivity to sounds begins to decline as the sound frequency increases. Human sensitivity declines to 0 to sounds above about 20 kHz. In other words, sounds above about 20 kHz are generally inaudible to humans.

Humans are particularly sensitive to tones, such as tone 204, with frequencies in the audible frequency band. Human audible tones are repetitive sounds with a fundamental frequency in the audible frequency band. Humans are less sensitive to non-tonal, or noise-like sounds.

Referring to FIGS. 1 and 2, all magnetic circuit components of power control system 100 are small speakers. Physical forces on the wires and magnetic circuit components of power control system 100 cause the wires and components to vibrate at the switching frequency of switch control signal $CS_0$. Switching frequencies below 20 kHz can produce audible tones that are generally deemed undesirable. Since the power demand by load 112 tends to change very little over a short period of time, such as 2-4 seconds, the frequency of switch control signal $CS_0$ would remain approximately constant and produce an audible tone for switching frequencies less than 20 kHz.

Lower switching frequencies of switch control signal $CS_0$ are generally desirable. High voltage transistors, diodes, and inductors often have significant parasitic capacitances that make high frequency switching of switch 108 inefficient. Additionally, high frequency switching increases electromagnetic interference (EMI) of power control system 100. Although lower switching frequencies are desirable, power control system 100 typically avoids switching frequencies below 20 kHz to avoid generating audible tones. Thus, the production of tones by power control system 100 limits the switching frequency range of switch 108.

SUMMARY OF THE INVENTION

In one embodiment of the present invention, a system includes a switch mode controller to generate a switch control signal to control conductivity of a switching mode switch included in a switching power converter. The switch mode controller includes a period generator to determine a nominal period of the switch control signal and to vary the nominal period to generate a broad frequency spectrum of the switch control signal when the nominal period corresponds with a frequency in at least a portion of an audible frequency band.

In another embodiment of the present invention, a method includes generating a switch control signal to control conductivity of a switch mode switch included in a switching power converter. The method also includes determining a nominal period of the switch control signal and varying the nominal period to generate a broad frequency spectrum of the switch control signal when the nominal period corresponds with a frequency in at least a portion of an audible frequency band. The method further includes determining a pulse width of the switch control signal and providing the switch control signal to the switch of the switching power converter.

In a further embodiment of the present invention, a power control system includes a switching power converter having a switch and a switch mode controller to generate a switch control signal to control conductivity of a switching mode switch included in a switching power converter. The switch mode controller includes a period generator to determine a nominal period of the switch control signal and to vary the nominal period to generate a broad frequency spectrum of the switch control signal when the nominal period corresponds with a frequency in at least a portion of an audible frequency band.

In another embodiment of the present invention, an apparatus includes means for generating a switch control signal to control conductivity of a switch mode switch included in a switching power converter. The apparatus further includes means for determining a nominal period of the switch control signal and means for varying the nominal period to generate a broad frequency spectrum of the switch control signal when the nominal period corresponds with a frequency in at least a portion of an audible frequency band. The apparatus also includes means for determining a pulse width of the switch control signal and means for providing the switch control signal to the switch of the switching power converter.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A power control system includes a switch mode controller to control the switching mode of a switching power converter. In at least one embodiment, the switch mode controller also controls power factor correction of the switching power converter. The switch mode controller generates a switch control signal that controls conductivity of a switch of the switching power converter. Controlling conductivity of the switch controls the switch mode of the switching power converter. The switching power converter can be any type of switching power converter, such as a buck mode, boost mode, boost-buck mode, Cúk, mode, Sepic mode, and so on. The switch mode controller controls the switch consistent with the switching power converter type. To control power factor correction, the switch mode controller causes an input current to the switching power converter to vary in approximate proportion to a time varying voltage source signal supplied to the switching power converter.

The switch mode controller includes a period generator to determine a period of the switch control signal and to vary the determined period to generate a broad frequency spectrum of the switch control signal when the determined period corresponds with a frequency in at least a portion of the audible frequency band. Generating a switch control signal with a broad frequency spectrum in the audible frequency band allows the power control system to utilize switching frequencies in the audible frequency band that have relatively low power at any particular frequency and, in at least one embodiment, tones are also avoided. The broad frequency spectrum can be shaped to minimize power in frequencies within particularly sensitive areas of the audible frequency band. Thus, the power control system can utilize switching frequencies in the audible frequency band without generating sounds.

Figure 1:
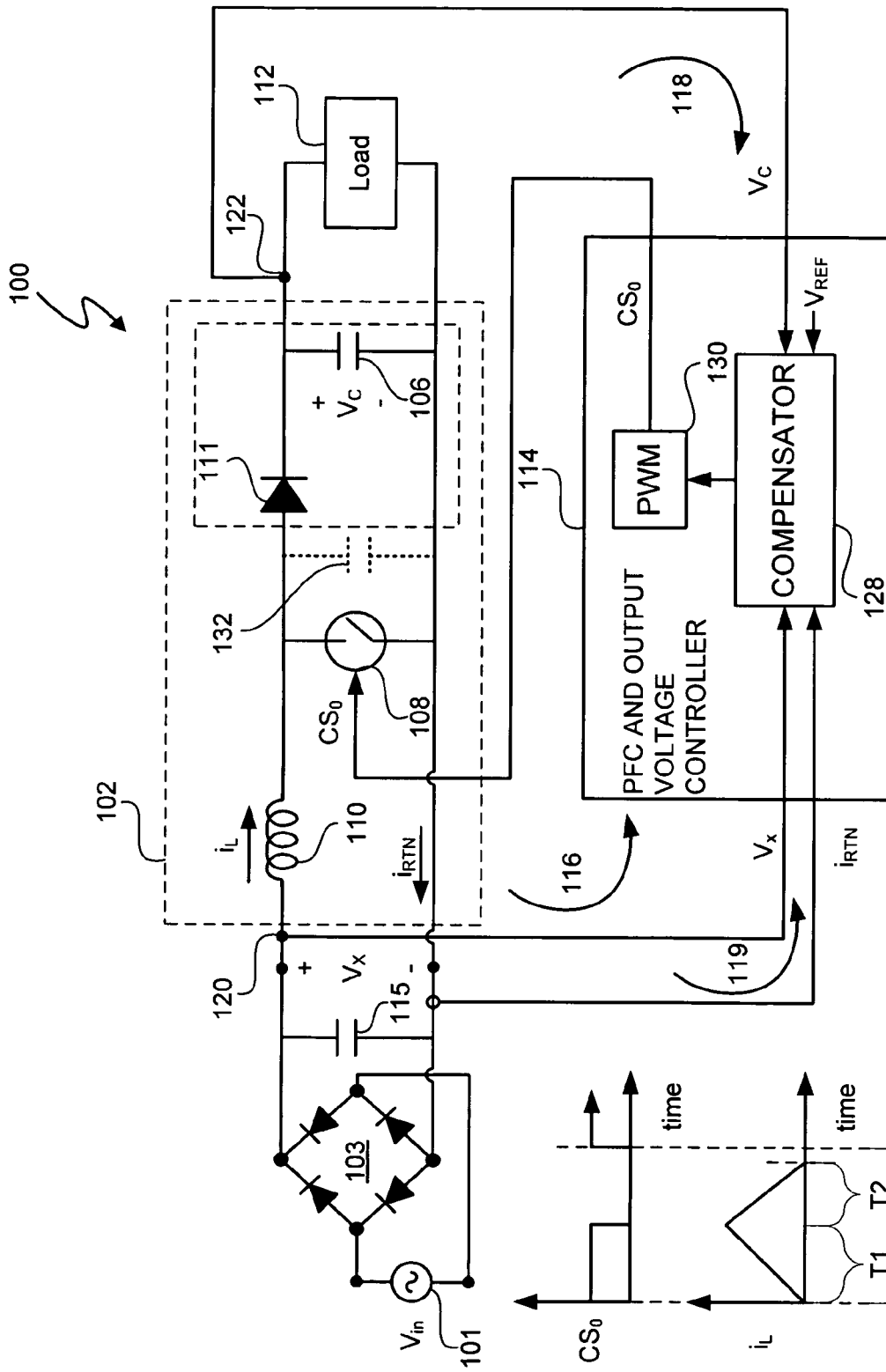
FIG. 1 (labeled prior art) depicts a power control system, which includes a switching power converter.
Figure 2:
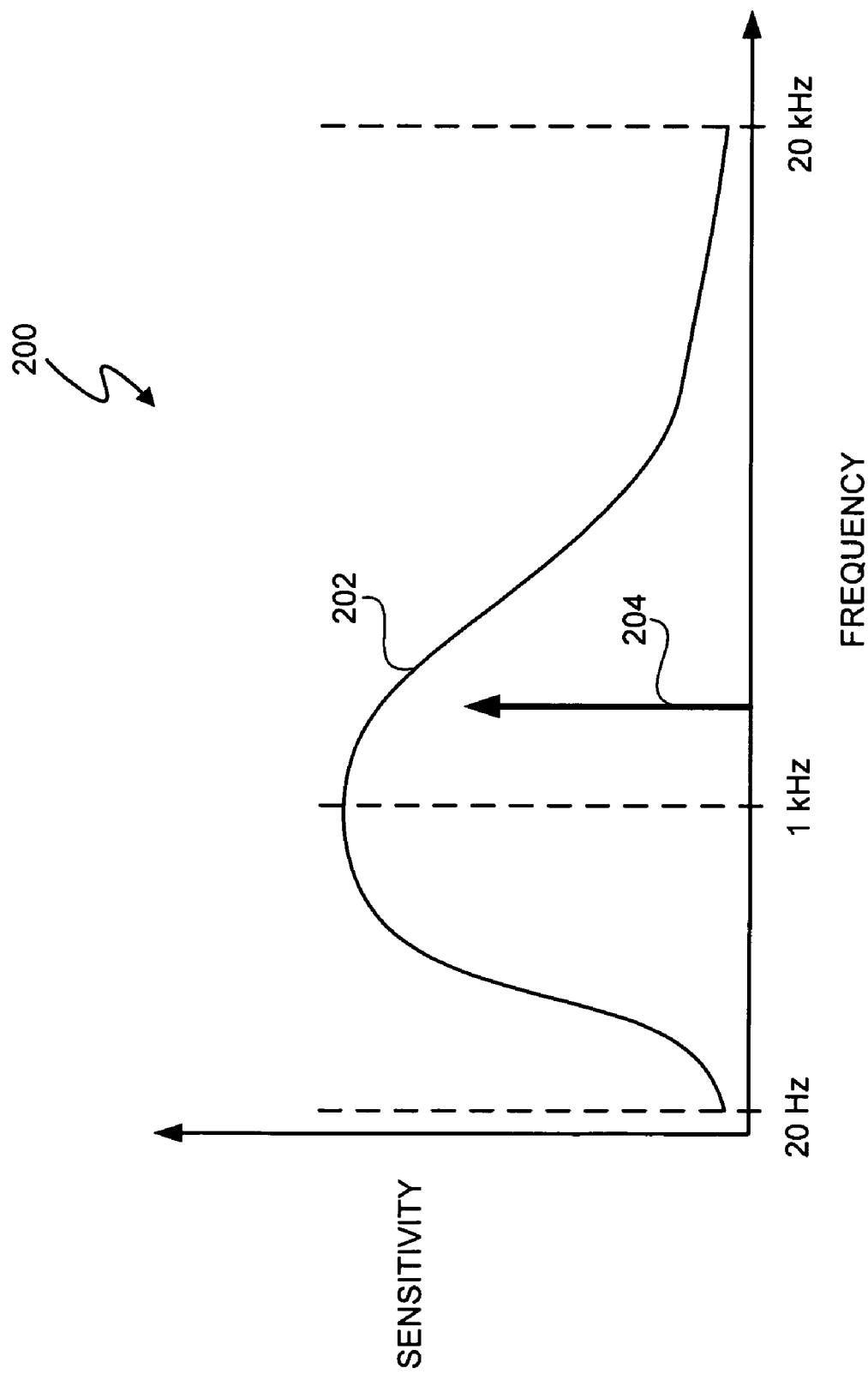
FIG. 2 (labeled prior art) depicts a human audible sensitivity versus audible frequency band graph.
Figure 3A:
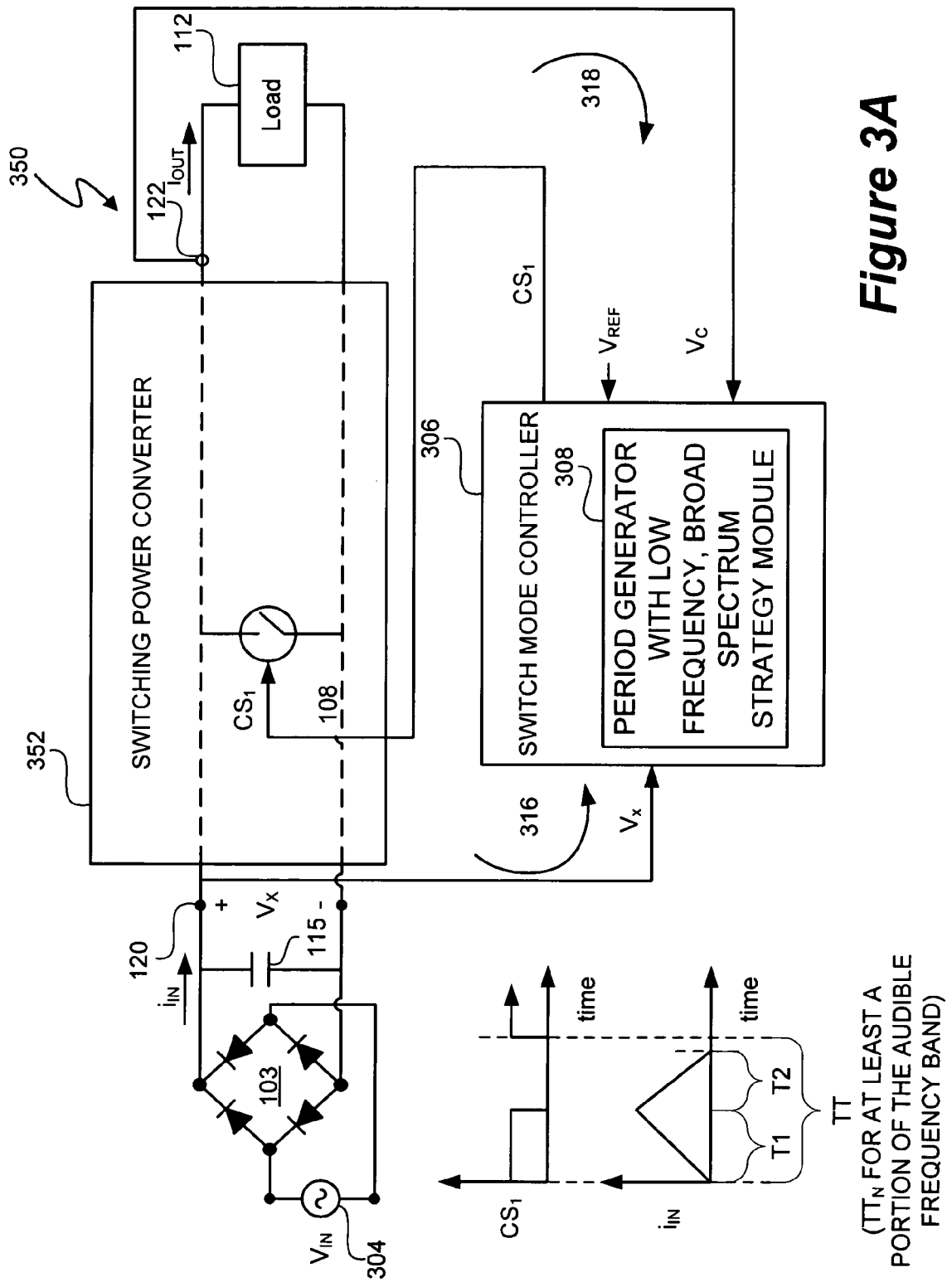
FIG. 3A depicts a power control system having a switching power converter and a switch mode controller with a low frequency, broad spectrum strategy module.

FIG. 3A depicts a power control system 350 having a switching power converter 352 and a switch mode controller 306. The switching power converter 350 can be any type of switching power converter, such as a buck mode, boost mode, boost-buck mode, Cúk, mode, Sepic mode, and so on. The switch mode controller 306 controls the switch mode switch 108 (referred to herein as "switch 108") consistent with the switching power converter type. Power control system 350 is subsequently described primarily with reference to a boost type switching power converter. The principles of switch mode controller 306 determining a period of the switch control signal $CS_1$ and varying the determined period to generate a broad frequency spectrum of the switch control signal $CS_1$ when the determined period corresponds with a frequency in at least a portion of the audible frequency band are applicable to any type of switching power converter. In at least one embodiment, the determined period that is varied is referred to as the nominal period $TT_N$. The portion or portions of the audible frequency band in which the corresponding period of switch control signal $CS_1$ is varied is a matter of design choice. In at least one embodiment, the portion is all of the audible frequency band. In another embodiment, the portion is the audible frequency band in which humans are most sensitive, e.g. 50 Hz-10 kHz.

Figure 3B:
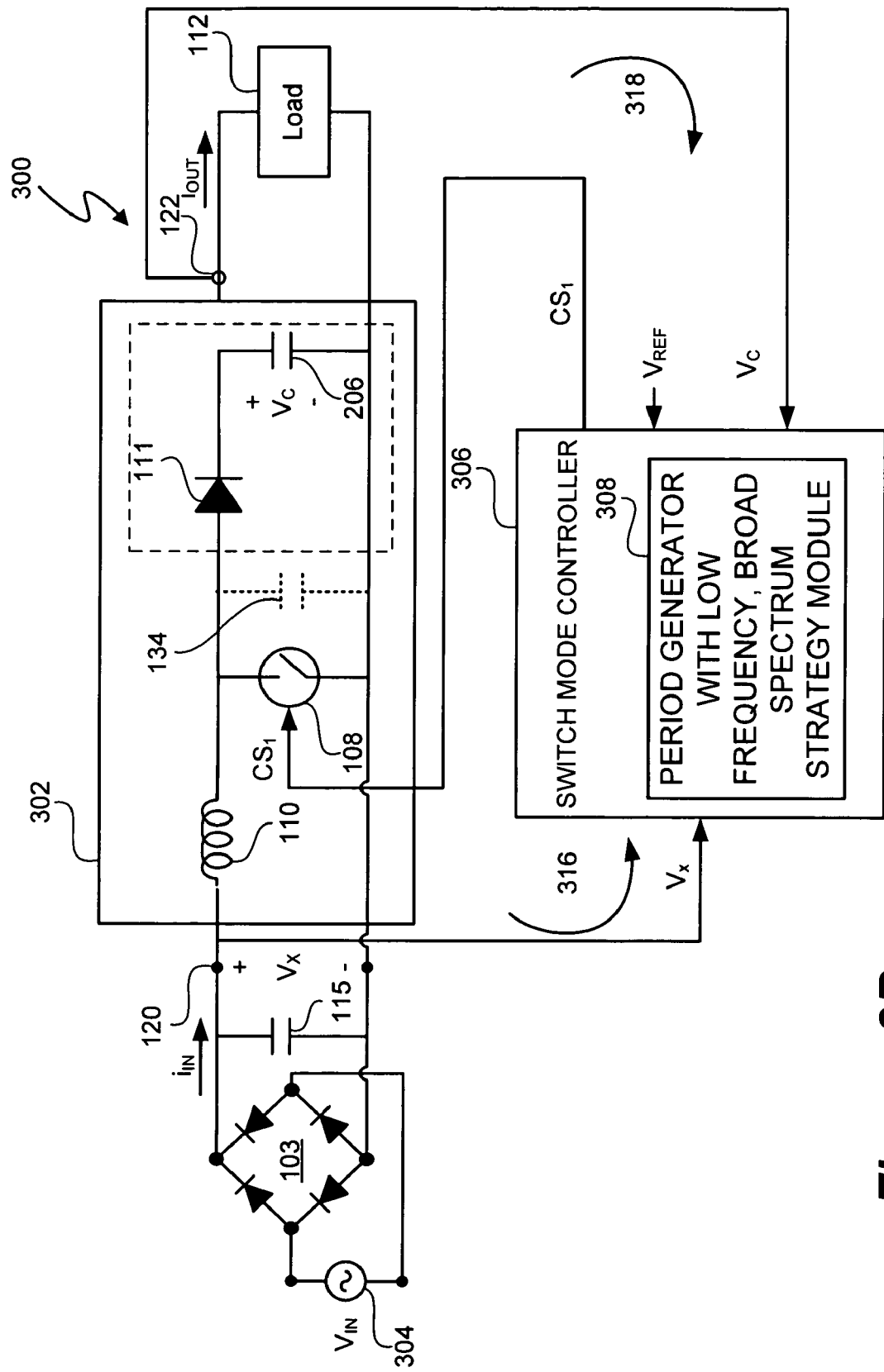
FIG. 3B depicts a power control system having a boost type switching power converter and a switch mode controller with a low frequency, broad spectrum strategy module.

FIG. 3B depicts a power control system 300 having a switching power converter 302 and a switch mode controller 306. Power control system 300 represents one embodiment of power control system 350. Switching power converter 302 is a boost-type converter, and switching power converter 302 represents one embodiment of switching power converter 352. The switching power converter 302 can be any type of switching power converter, such as a buck mode, boost mode, boost-buck mode, Cúk, mode, Sepic mode, and so on. The switch mode controller controls the switch consistent with the switching power converter type.

The switch mode controller 306 includes and utilizes a period generator 308 with a low frequency, broad spectrum strategy module to generate a pulse width modulated switch control signal $CS_1$. The switch mode controller 306 generates switch control signal $CS_1$ using feedback signals representing the primary supply voltage $V_X$ and output voltage $V_C$. In at least one embodiment, switching power converter 302 is configured in the same manner as switching power converter 102. Rectifier 103 rectifies the input voltage $V_{IN}$ supplied by voltage source 304 to generate time varying, primary supply voltage $V_X$. In at least one embodiment, voltage source 304 is identical to voltage source 101, and input voltage $V_{IN}$ is identical to the mains voltage $V_{mains}$.

In at least one embodiment, when the period generator 308 determines a period TT of the switch control signal $CS_1$ with a corresponding frequency in the audible frequency band, the period generator 308 broadens the spectrum of the switch control signal $CS_1$ to minimize the audibility of any sounds resulting from the switching of switch mode switch 108. The period generator 308 can utilize any of a number of low frequency, broad spectrum strategies. In at least one embodiment, the period generator 308 can also broaden the spectrum of switch control signal $CS_1$ for non-audible frequencies in the same manner as broadening the spectrum of the switch control signal $CS_1$ for audible frequencies to, for example, reduce EMI emissions.

To control power factor correction, the switch mode controller 306 causes the input current $i_{IN}$ to the switching power converter 302 to vary in approximate proportion to a time varying voltage source signal supplied to the switching power converter. U.S. patent application Ser. No. 11/967,269, entitled "Power Control System Using a Nonlinear Delta-Sigma Modulator with Nonlinear Power Conversion Process Modeling", filed on Dec. 31, 2007, assignee Cirrus Logic, Inc., and inventor John L. Melanson describes exemplary systems and methods for controlling power factor correction and is incorporated herein by reference in its entirety.

Figure 4:
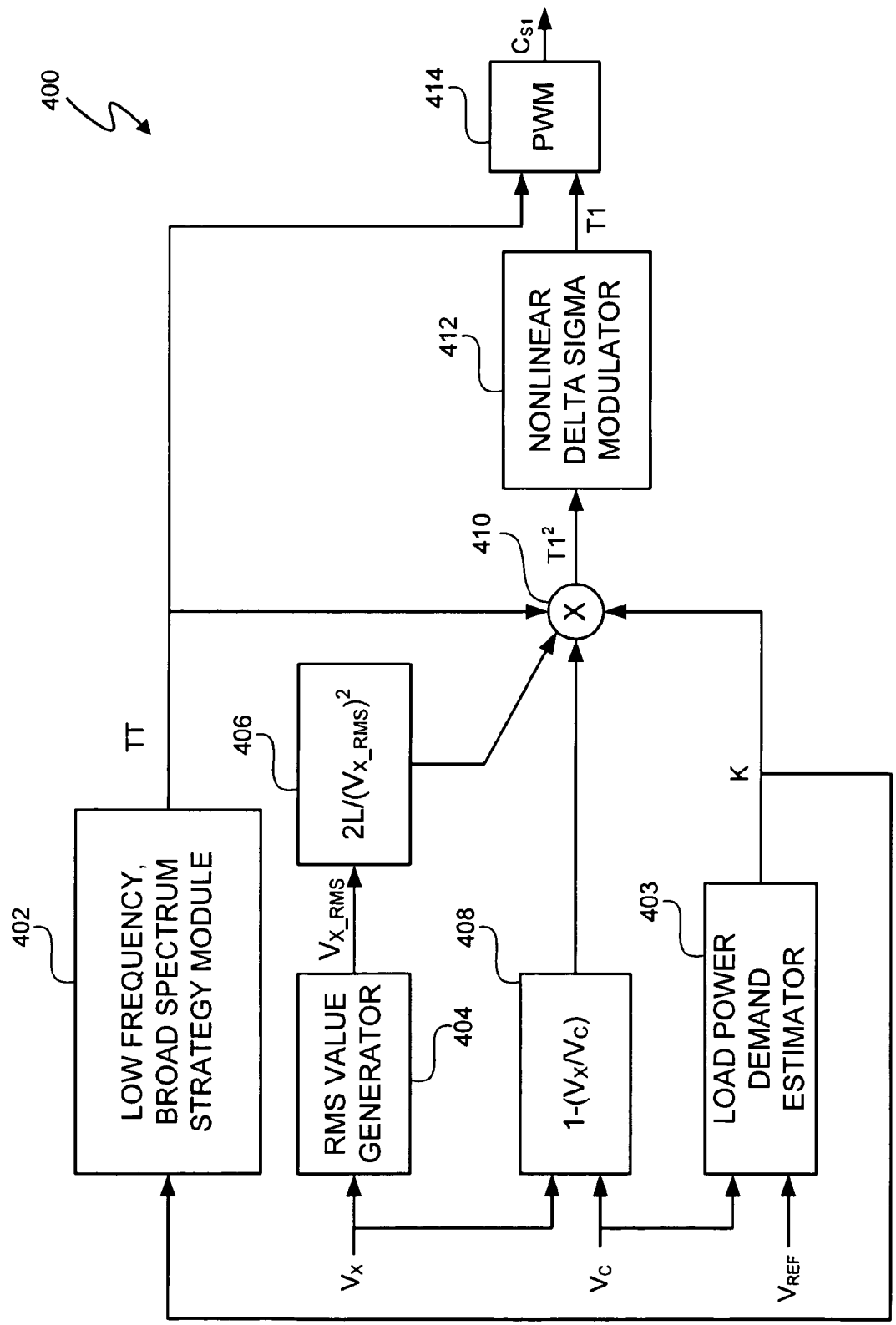
FIG. 4 depicts a power control system having a switching power converter and a control signal period-power transfer correlation strategy module.

FIG. 4 depicts a switch mode controller 400, which represents one embodiment of switch mode controller 306. The switch mode controller 400 determines switch control signal $CS_1$ in accordance with the switch control signal generation strategy implemented by low frequency, broad spectrum strategy module 402. As subsequently described in more detail, the low frequency, broad spectrum strategy module 402 represents one embodiment of the strategy utilized by period generator 308 to generate a period TT of switch control signal $CS_1$ to broaden the spectrum of switch control signal $CS_1$ in at least the audible frequency band in response to the estimated power demand of load 112. In at least one embodiment, the estimated power demand of load 112 is represented by K, and K is provided as an input to low frequency, broad spectrum strategy module 402. "K" is the output of the load power demand estimator 403. In another embodiment, the estimated power delivered to load 112 is estimated by multiplying the average output voltage $V_C$ obtained via voltage control loop 318 and the average output current $i_{OUT}$ of switching power converter 402, and the product can be provided to or determined by low frequency, broad spectrum strategy module 402. The determination of the estimated power delivered to load 112 is a matter of design choice and can be determined in any of a number of ways.

The switch mode controller 400 determines a period TT of switch control signal $CS_1$ and pulse width T1 of switch control signal $CS_1$. In at least one embodiment, the square of the pulse width period T1, i.e. $T1^2$, is determined in accordance with Equation [1]:

$$T1^2 = \frac{2 \cdot L}{V_{X\_RMS}^2} \cdot K \cdot TT \cdot \left(1 - \frac{V_X}{V_C}\right) \quad 1$$

"T1" is the pulse width time of the control signal $CS_1$. "L" represents an inductor value of inductor 110. $V_{X\_RMS}$ represents the primary supply RMS voltage $V_{X\_RMS}$. "K" represents an estimate of the power demand of load 112 as determined by load power demand estimator 403 in the voltage control loop 418. "TT" is the period of control signal $CS_1$ as generated by control signal period generation strategy module 402. "$V_X$" is a sampled value of the current value of primary supply voltage $V_X$. "$V_C$" is a sampled value of the output voltage $V_C$ from the voltage control loop 418. In the preferred embodiment, the calculation Equation [1] is performed in fixed-point arithmetic with appropriately scaled values and work lengths.

For switch control signal $CS_1$ frequencies in at least a portion of the audible frequency band, the switch control signal $CS_1$ period TT is referred to as a nominal period $TT_N$ (FIG. 3A). The nominal period $TT_N$ corresponds to a nominal frequency $f_N$ of the switch control signal $CS_1$. In at least one embodiment, the period generator 308 varies the nominal period $TT_N$ to generate a broad frequency spectrum of the switch control signal $CS_1$. The actual value of the nominal period $TT_N$ is a matter of design choice and is, for example, dependent upon the values of the components of switching power converter 402 such as the characteristics of inductor 110, switch 108, capacitor 106, and diode 111 along with the instantaneous primary supply voltage $V_X$, the primary supply RMS voltage $V_{X\_RMS}$, and the power transferred to load 112. As described subsequently in more detail, the low frequency, broad spectrum strategy module 402 varies the nominal period $TT_N$ to broaden the frequency spectrum of the nominal frequency $f_N$ when the nominal frequency $f_N$ resides in at least a portion of the audible frequency band.

The RMS value generator 404 determines primary supply RMS voltage $V_{X\_RMS}$ from a sampled primary supply voltage $V_X$ from voltage loop 316. Module 406 receives the primary supply RMS voltage $V_{X\_RMS}$ value and determines $2 \cdot L/(V_{X\_RMS}^2)$. "$2 \cdot L/(V_{X\_RMS}^2)$" represents a scaling factor. Boost factor module 408 determines a boost factor $(1-V_X/V_C)$. Multiplier 410 multiplies switch control signal $CS_1$ period TT, the output value of module 406, the output value of boost factor module 408, and estimated power demand K to generate $T1^2$. Nonlinear delta-sigma modulator 412 determines the pulse width T1 of switch control signal $CS_1$. Pulse width modulator (PWM) 414 receives the pulse width time T1 and period TT and generates switch control signal $CS_1$ so that switch control signal $CS_1$ has a pulse width of T1 and a period of TT.

In at least one embodiment, to ensure that switching power converter 302 operates in DCM, the value L of inductor 110 is set in accordance with Equation [2]:

$$L = V_{min}^2 \Big/ \left[ (P_{max} \cdot J) \cdot (2 \cdot f_{max}) \cdot \left[ 1 - \sqrt{2}\left(\frac{V_{min}}{V_{cap}}\right)\right]\right]. \quad [2]$$

"L" is the value of the inductor 110. "$V_{min}$" is the minimum expected primary supply RMS voltage $V_{X\_RMS}$. "$P_{max}$" is the maximum power demand of load 112. "J" is an overdesign factor and any value greater than 1 indicates an overdesign. In at least one embodiment, "J" is 1.1. "$f_{max}$" is a maximum frequency of control signal $CS_1$. "$V_C$" is a nominal expected output voltage $V_C$. The flyback time T2 can be determined in accordance with Equation [3]:

$$T2 = \frac{V_X}{V_C - V_X}. \quad [3]$$

In at least one embodiment, to avoid saturation of inductor 110, the value L of inductor 110 is chosen so that a peak input current, $i_{IN\_PEAK}$ is greater than or equal to the greatest value of $V_X \cdot T1/L$. Generally, the peak input current $i_{IN\_PEAK}$ occurs at full output power at the peak of primary supply voltage $V_X$ during low line voltage operation.

Figure 5:
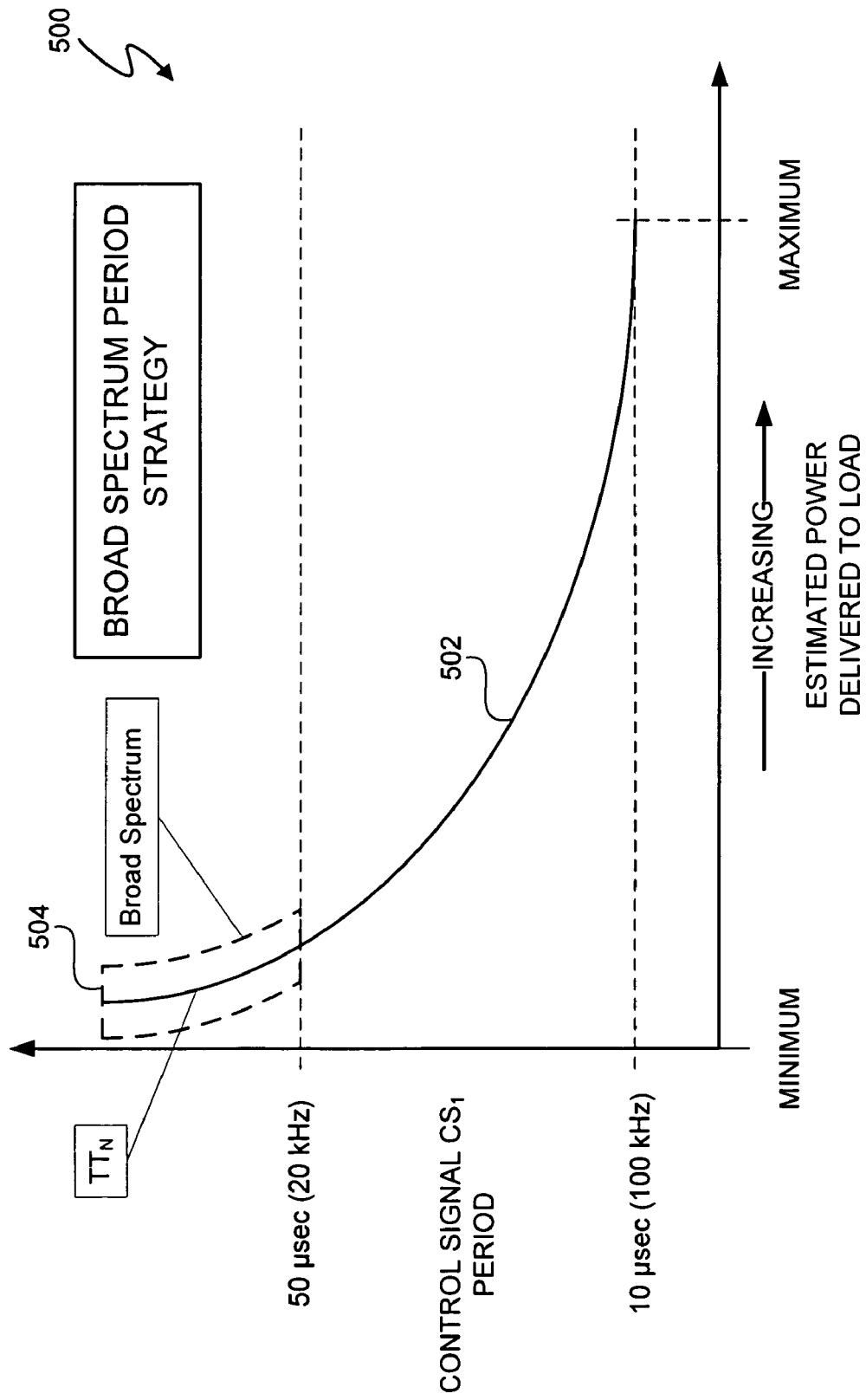
FIG. 5 depicts a low frequency, broad spectrum strategy.

FIG. 5 depicts an exemplary low frequency, broad spectrum strategy 500 to broaden the spectrum of switch control signal $CS_1$ for switching frequencies in the audible frequency band. The particular frequency broadening strategy and the range of nominal periods $TT_N$'s are matters of design choice. The estimated power delivered to load 112 versus switch control signal $CS_1$ period TT curve 502 depicts an inverse relationship between the estimated power delivered to load 112 and the period TT of switch control signal $CS_1$. The curve 502 depicts the nominal period $TT_N$ that corresponds to the nominal frequency $f_N$ of switch control signal $CS_1$. The particular relationship between the estimated power delivered to load 112 versus switch control signal $CS_1$ period TT curve 502 can vary and is a matter of design choice.

When the nominal period TT of switch control signal $CS_1$ exceeds 50 microseconds, the nominal frequency $f_N$ of switch control signal $CS_1$ is in the audible frequency band, and the low frequency, broad spectrum strategy module 402 varies the nominal period $TT_N$ to generate a broad frequency spectrum of switch control signal $CS_1$. The dashed box 504 depicts a spreading of the period TT around the nominal period $TT_N$ corresponding to the nominal frequency $f_N$ and, thus, indicates a broadening of the frequency spectrum of switch control signal $CS_1$. Broadening the frequency spectrum of switch control signal $CS_1$ spreads the power of tones, thus reducing power at any particular frequency. Broadening the frequency spectrum of switch control signal $CS_1$ allows switch mode controller 306 to generate switch control signal $CS_1$ with periods at or above 50 microseconds while minimizing power at audible frequencies.

In at least one embodiment, the inverse relationship between the estimated power delivered to load 112 and the period TT of switch control signal $CS_1$ improves the efficiency of switch mode controller 306 as described with respect to exemplary systems and methods in U.S. patent application Ser. No. 12/114,147, now U.S. Pat. No. 7,894,216, entitled "Switching Power Converter With Efficient Switching Control Signal Period Generation", filed concurrently with the present application, assignee Cirrus Logic, Inc., and inventor John L. Melanson, which is incorporated herein by reference in its entirety.

Figure 6:
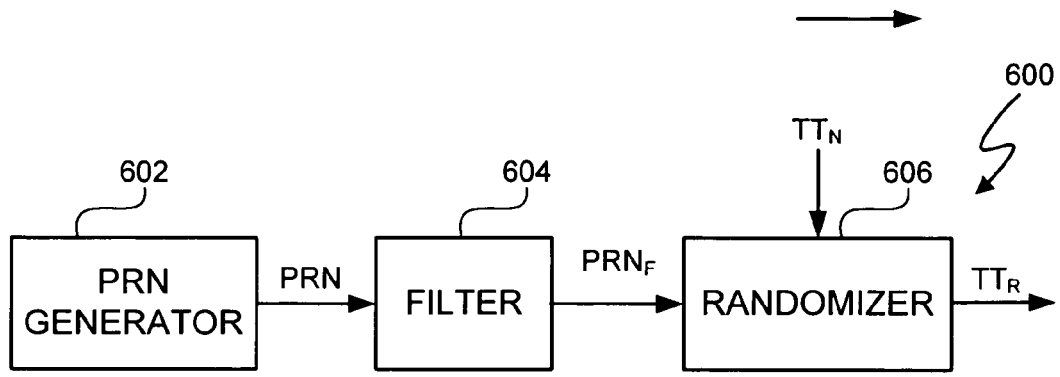
FIGS. 6-8 depict low frequency, broad spectrum strategy modules.

FIG. 6 depicts a low frequency, broad spectrum strategy module 600, and low frequency, broad spectrum strategy module 600 represents one embodiment of low frequency, broad spectrum strategy module 402 when the nominal period $TT_N$ is greater than or equal to 50 microseconds. The strategy module 600 generates periods TTs of switch control signal $CS_1$ to broaden the frequency spectrum of switch control signal $CS_1$ and shift the frequencies of switch control signal $CS_1$ corresponding to the periods generated by strategy module 600 into areas of lower human sensitivity.

The strategy module 600 includes a pseudorandom number (PRN) generator 602 that generates a pseudorandom number PRN. The pseudorandom number PRN is provided to filter 604 to generate a filtered pseudorandom number $PRN_F$. In at least one embodiment, filter 604 is a high pass filter having a transfer function of, for example, $(1-z^{-1})/(1-0.99\ z^{-1})$. "$z^{-1}$" represents a unit delay in the z-domain. The filtered pseudorandom number $PRN_F$ is provided as an input to randomizer 606. In at least one embodiment, the filtered pseudorandom number $PRN_F$ is scaled and processed along with the nominal period $TT_N$ to generate the randomized period $TT_R$. The strategy module 600 repeats the generation of the randomized period $TT_R$ to generate multiple randomized periods $TT_R$'s to broaden the spectrum of the nominal period $TT_N$. In at least one embodiment, the scaling of filtered pseudorandom number $PRN_F$ determines the amount of frequency spreading of the switching frequencies of switch control signal $CS_1$. The randomizer 606 can process the filtered pseudorandom number $PRN_F$ and nominal period $TT_N$ in any of a number of ways. For example, the filtered pseudorandom number $PRN_F$ can be scaled such that the randomizer 606 can multiply the value of $TT_N$ times the pseudorandom number PRN to generate the randomized period $TT_R$, add the value of $TT_N$ to the pseudorandom number PRN, and so on, to determine a randomized value of nominal period $TT_N$. The particular scaling and frequency spread of switch control signal $CS_1$ is a matter of design choice. In at least one embodiment, the strategy module 600 has an operating frequency to generate multiple pseudorandom number PRN's, multiple filtered pseudorandom number $PRN_F$'s, and multiple randomized periods $TT_R$'s for each nominal period $TT_N$ so that the average of the randomized periods $TT_R$'s for each nominal period $TT_N$ approximately equals the nominal period $TT_N$. In at least one embodiment, using a high pass filter 604 results in the average of the randomized periods $TT_R$'s having an average value of the nominal period $TT_N$, and the high pass filter 604 has no DC component. The high pass filter 604 also shifts more sound energy into higher frequencies where the human ear is less sensitive.

In at least one embodiment, filter 604 is a low pass filter. A low pass filter 604 performs an averaging function so that an average of the randomized periods $TT_R$'s over time will equal the nominal period $TT_N$. In at least one embodiment, the strategy module 600 is designed so that the average of the periods TT generated over a 2-4 second time frame average to the nominal period $TT_N$.

Figure 9:
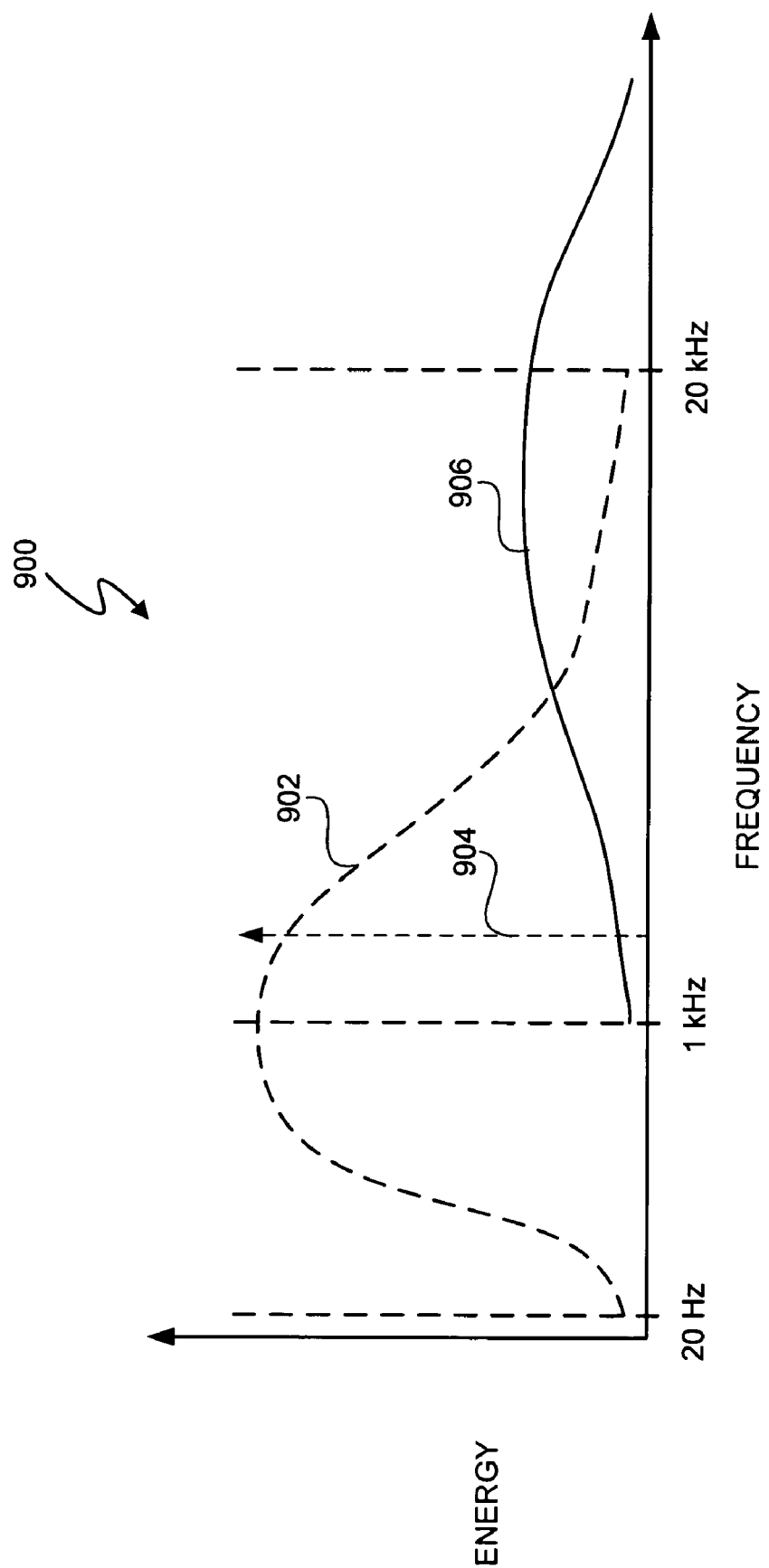
FIGS. 9-11 depict energy versus frequency graphs for a switch control signal corresponding to respective FIGS. 6-8.

FIG. 9 depicts an energy versus frequency graph 900 of the frequency spectrum of switch control signal $CS_1$ generated by strategy module 600 with a low pass filter 604. Sensitivity plot 902 indicates human hearing sensitivity levels versus frequency. The dashed tone 904 indicates the frequency and energy of switch control signal $CS_1$ for a period TT of switch control signal $CS_1$ generated without broadening the frequency spectrum of switch control signal $CS_1$. The switch control signal $CS_1$ frequency graph 906 represents an exemplary broadening of the frequency associated with the period of tone 904. The frequencies of switch control signal $CS_1$ in graph 906 generated by strategy module 600 are in a frequency range that is less sensitive to humans.

Figure 7:
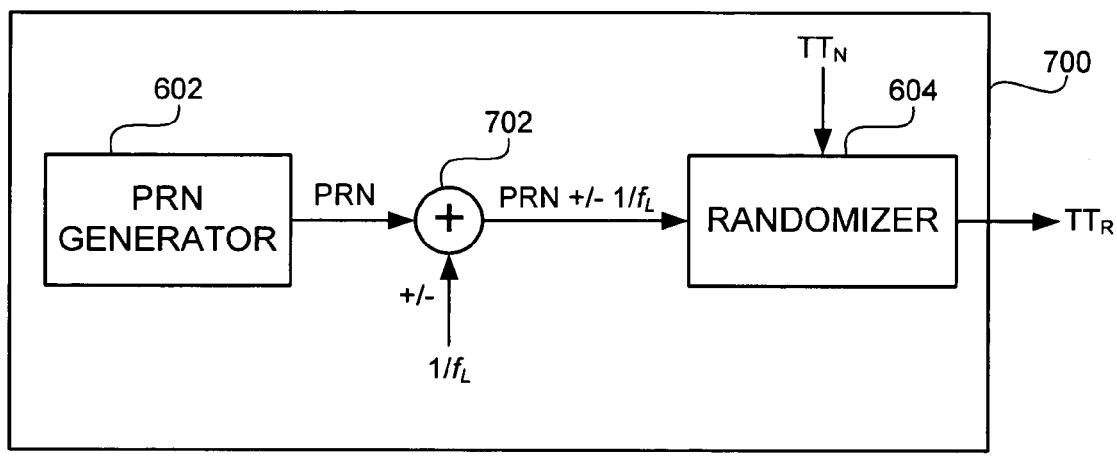

FIG. 7 depicts a low frequency, broad spectrum strategy module 700, and low frequency, broad spectrum strategy module 700 represents one embodiment of low frequency, broad spectrum strategy module 402 when the nominal period $TT_N$ is greater than or equal to 50 microseconds. The pseudorandom number PRN generator 602 generates pseudorandom number pseudorandom number PRN. Adder 702 adds an approximately equal number of $1/f_L$ and $-1/f_L$ to the pseudorandom number PRN. "$f_L$" represents minimum and maximum frequency limits of the periods generated by strategy module 700. The randomizer 604 processes pseudorandom number PRN+/−$f_L$ and the nominal period $TT_N$ to generate the randomized period $TT_R$. In at least one embodiment, the randomizer 604 adds PRN+/−$f_L$ and the nominal period $TT_N$, and, in at least one embodiment, randomizer 604 multiplies PRN+/−$f_L$ and the nominal period $TT_N$. The randomization of nominal period $TT_N$ can be expressed in terms of a percentage of randomization. In other words, the nominal period $TT_N$ could be randomized by a factor of +/−x %, where "x" represents a particular percentage. The particular percentage is a design choice, and larger percentages generally represent broader spectrums of switch control signal $CS_1$. In at least one embodiment, the strategy module 700 has an operating frequency to generate multiple pseudorandom number PRN's and multiple randomized periods $TT_R$'s for each nominal period $TT_N$ so that the average of the randomized periods $TT_R$'s for each nominal period $TT_N$ approximately equals the nominal period $TT_N$. Thus, the frequency $1/TT_R$ is shifted by +/−$f_L$ to broaden the spectrum of switch control signal $CS_1$.

Figure 10:
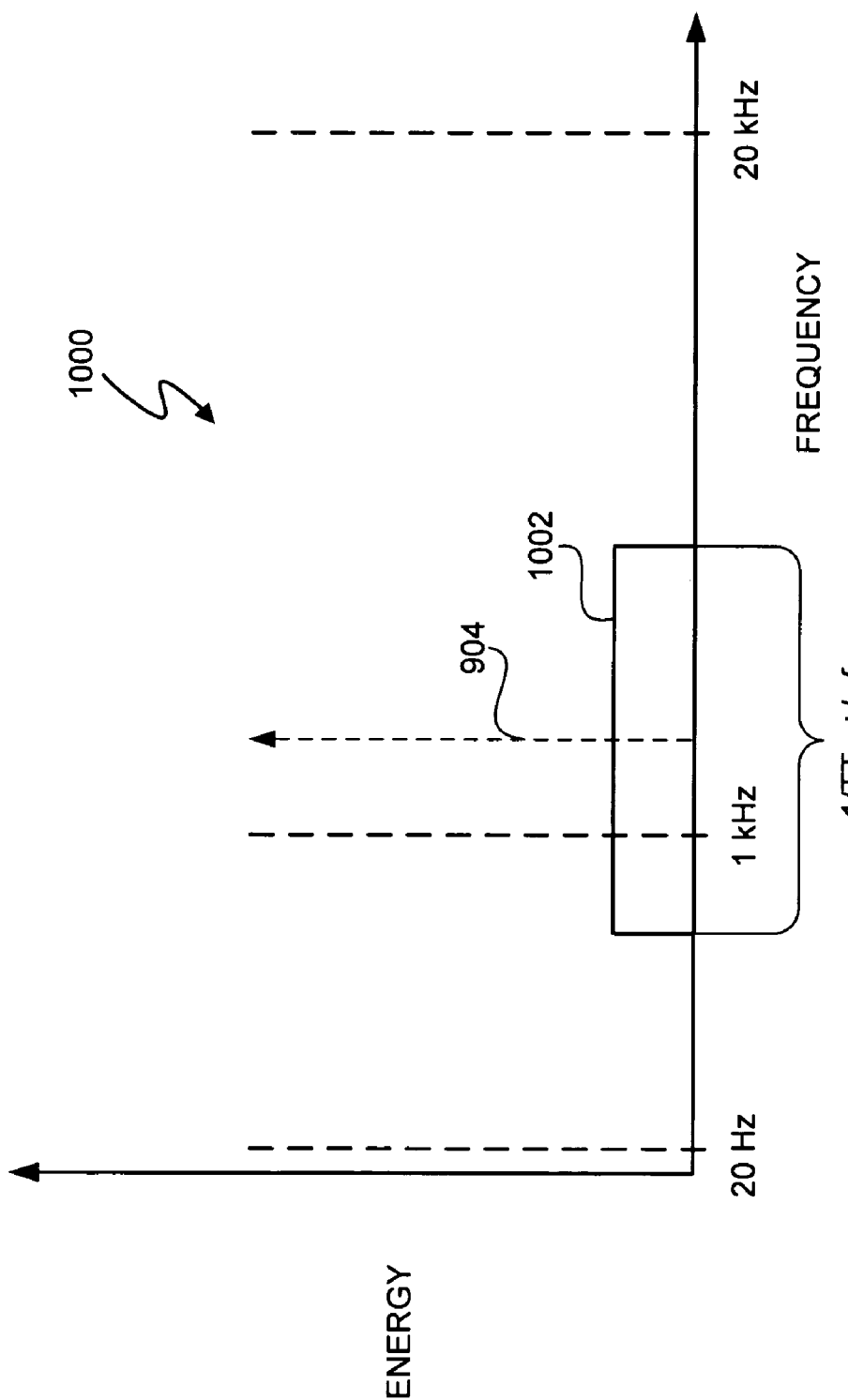

FIG. 10 depicts an energy versus frequency graph 1000 of the frequency spectrum of switch control signal $CS_1$ generated by strategy module 700. The dashed tone 904 indicates the frequency and energy of switch control signal $CS_1$ for a period TT of switch control signal $CS_1$ generated without broadening the frequency spectrum of switch control signal $CS_1$. As indicated by graph 1000, the frequencies of switch control signal $CS_1$ corresponding to the periods of switch control signal $CS_1$ generated by strategy module 700 are spread across frequencies as, for example, indicated by the frequency spectrum 1002 ranging from $1/TT_N-f_L$ to $1/TT_N+f$ and centered around the nominal frequency $f_N=1/TT_N$. The broadening of the frequency spectrum of switch control signal $CS_1$ avoids repeating tones and spreads energy across multiple frequencies so that any sounds generated by switch control signal $CS_1$ are less perceptible to humans.

Figure 8:
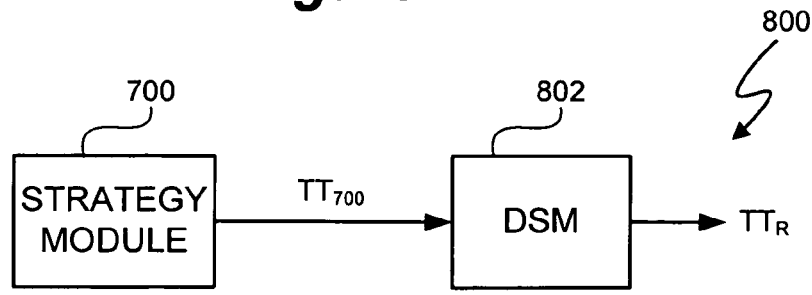

FIG. 8 depicts a low frequency, broad spectrum strategy module 800, and low frequency, broad spectrum strategy module 800 represents one embodiment of low frequency, broad spectrum strategy module 402 when the nominal period $TT_N$ is greater than or equal to 50 microseconds. Strategy module 800 modulates the output $TT_{700}$ of strategy module 700 with a delta-sigma modulator 802 to noise shape the broadened frequency spectrum of switch control signal $CS_1$ corresponding to the periods $TT_{700}$ generated by strategy module 700. The delta-sigma modulator 802 further broadens the spectrum of the nominal period $TT_N$ and also avoids repeating tones. In at least one embodiment, the strategy module 800 has an operating frequency sufficiently high so that the average of the randomized periods $TT_R$'s for each nominal period $TT_N$ approximately equals the nominal period $TT_N$. Exemplary conventional delta-sigma modulator design and operation is described in the book *Understanding Delta-Sigma Data Converters* by Schreier and Temes, IEEE Press, 2005, ISBN 0-471-46585-2.

Figure 11:
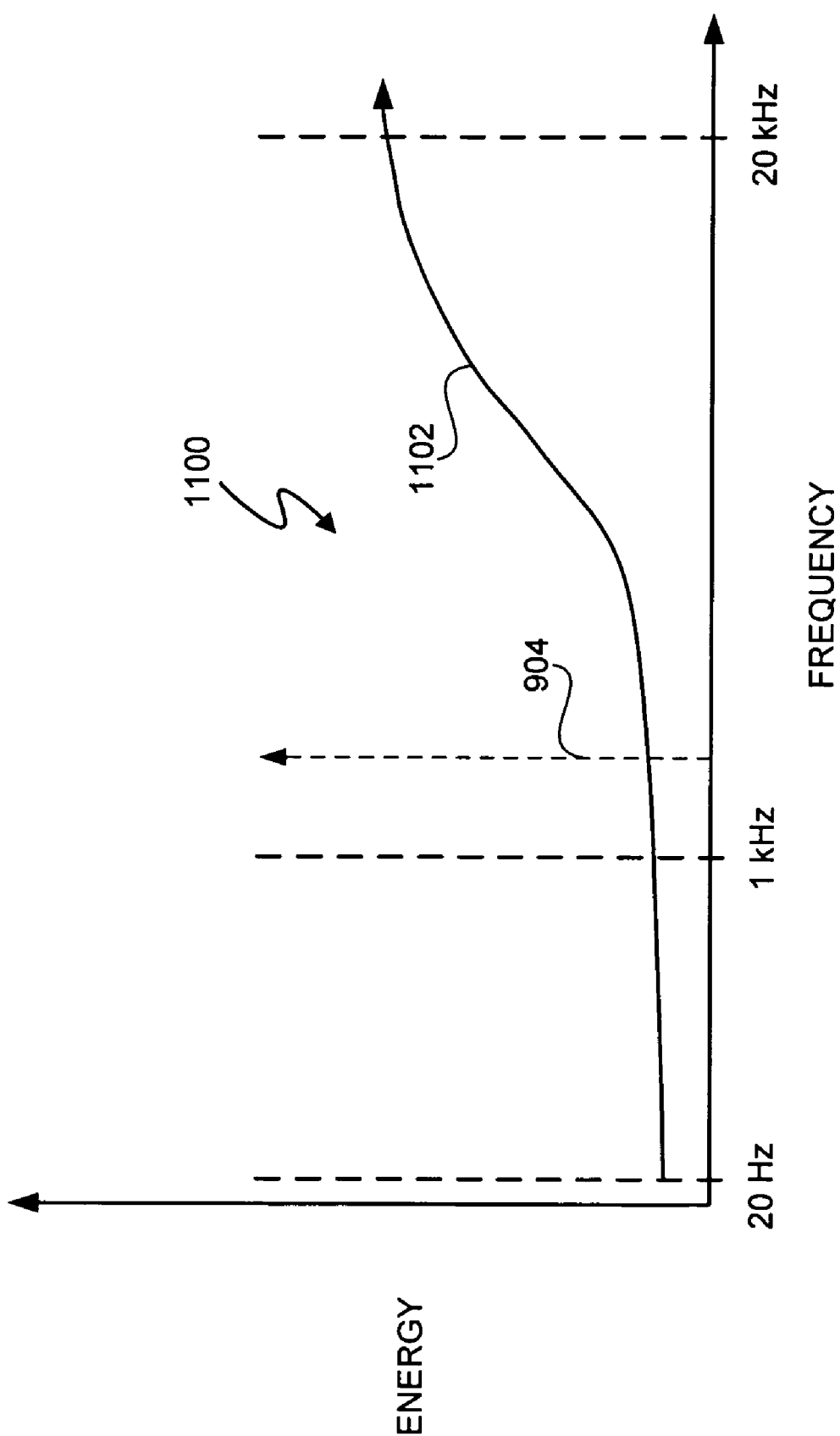

FIG. 11 depicts an energy versus frequency graph 1100 of the frequency spectrum of switch control signal $CS_1$ generated by strategy module 800. The dashed tone 904 indicates the frequency and energy of switch control signal $CS_1$ for a period TT of switch control signal $CS_1$ generated without broadening the frequency spectrum of switch control signal $CS_1$. As indicated by graph 1102, the frequencies of switch control signal $CS_1$ corresponding to the periods of switch control signal $CS_1$ generated by strategy module 800 are shaped to spread across frequencies in the audible frequency band. The broadening of the frequency spectrum of switch control signal $CS_1$ avoids repeating tones and spreads energy across multiple frequencies so that any sounds generated by switch control signal $CS_1$ are less perceptible to humans.

Figure 12:
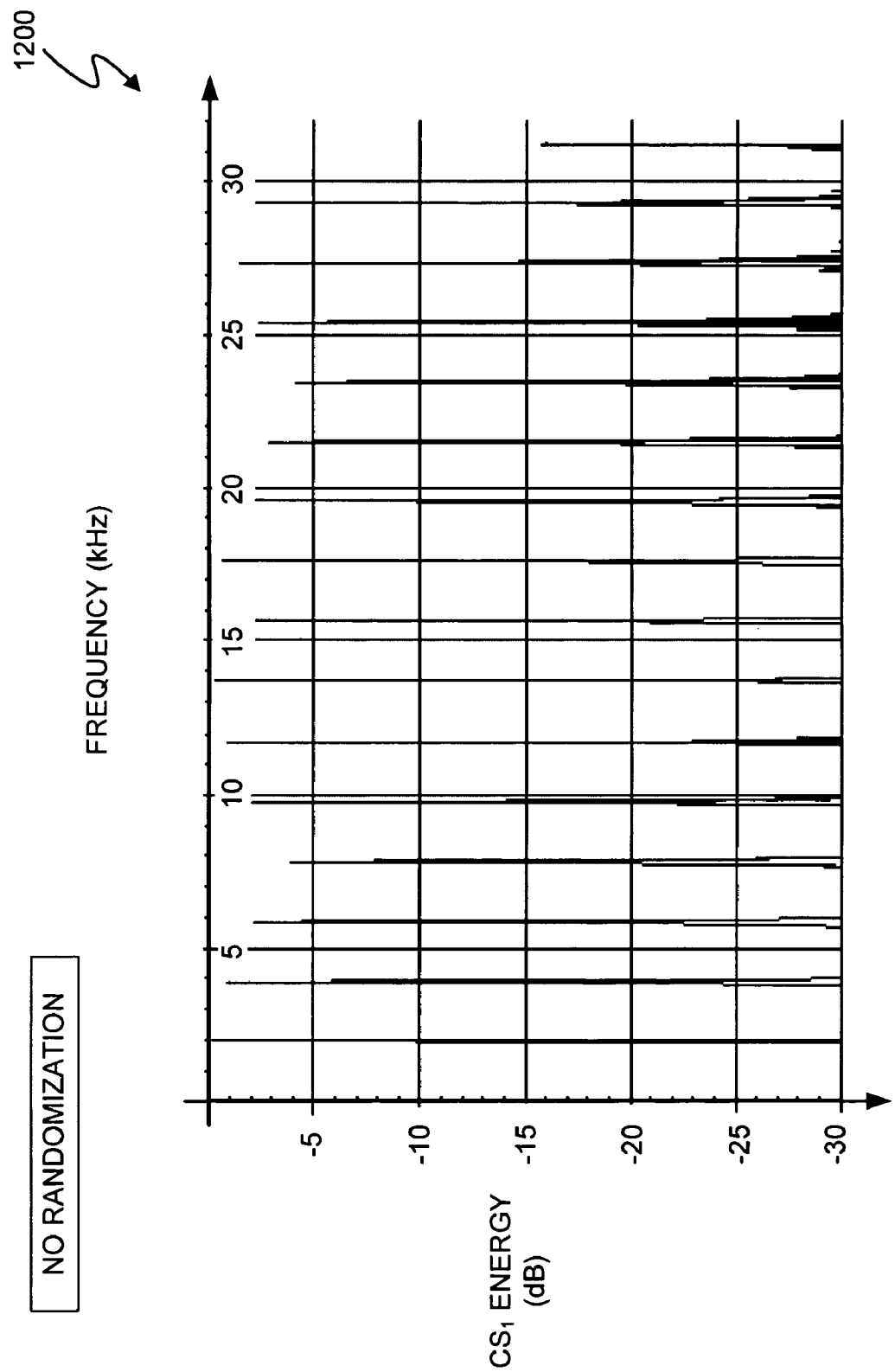
FIGS. 12-14 depict energy versus frequency graphs of switch control signal $CS_1$.

FIG. 12 depicts a frequency versus switch control signal $CS_1$ energy graph 1200 for determined periods TT's of switch control signal $CS_1$ corresponding to multiple frequencies within the audible frequency band. The graph 1200 represents no randomization of the determined periods TT's.

Figure 13:
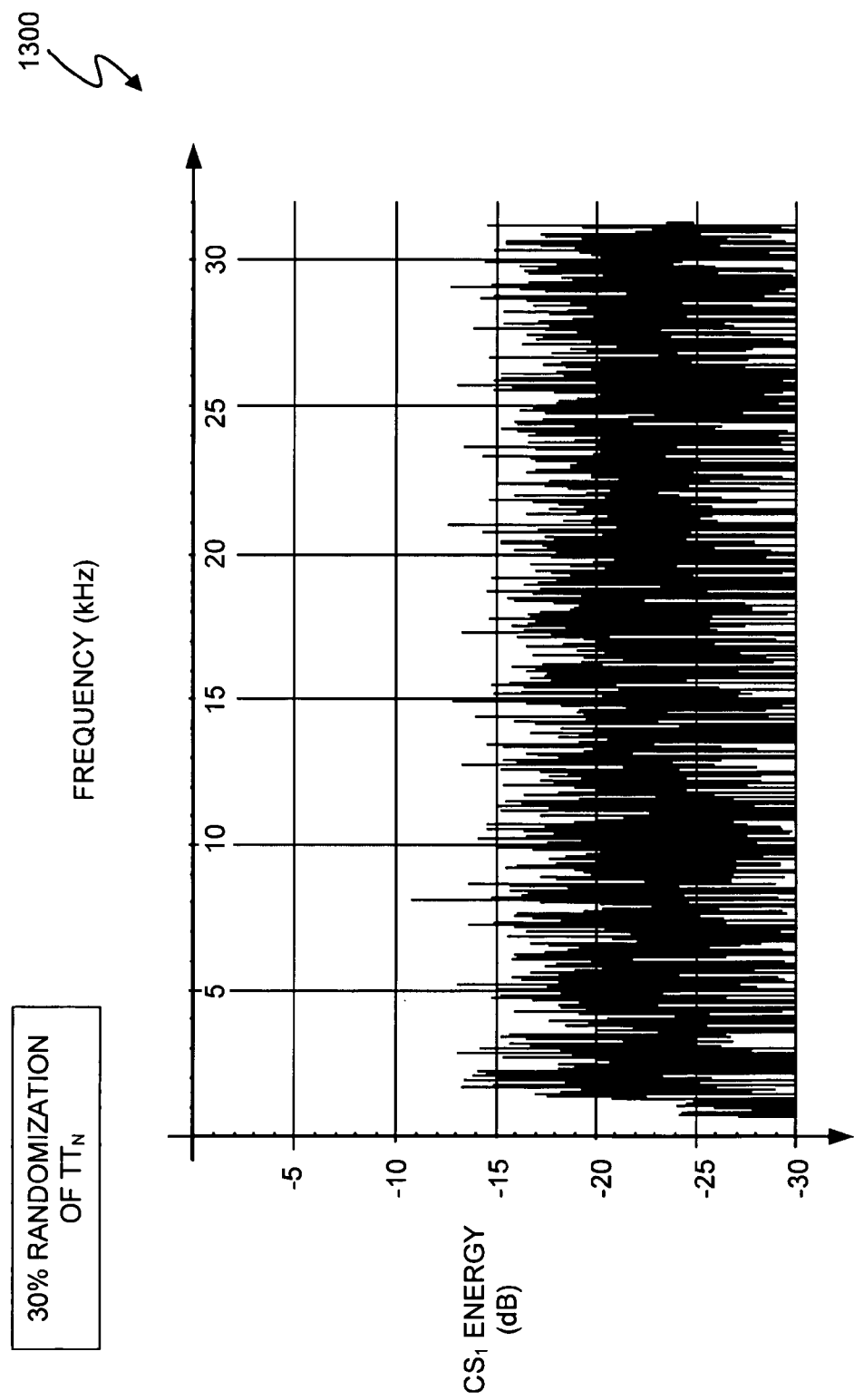

FIG. 13 depicts a frequency versus switch control signal $CS_1$ energy graph 1300 for randomized periods $TT_R$'s of multiple determined periods $TT_N$'s of switch control signal $CS_1$. The graph 1300 demonstrates a significant broadening of the spectrum of switch control signal $CS_1$ and lower peak energy levels relative to the peak energy levels of graph 1200. The lower peak energy levels result in lower energy sound caused by switch control signal $CS_1$.

Figure 14:
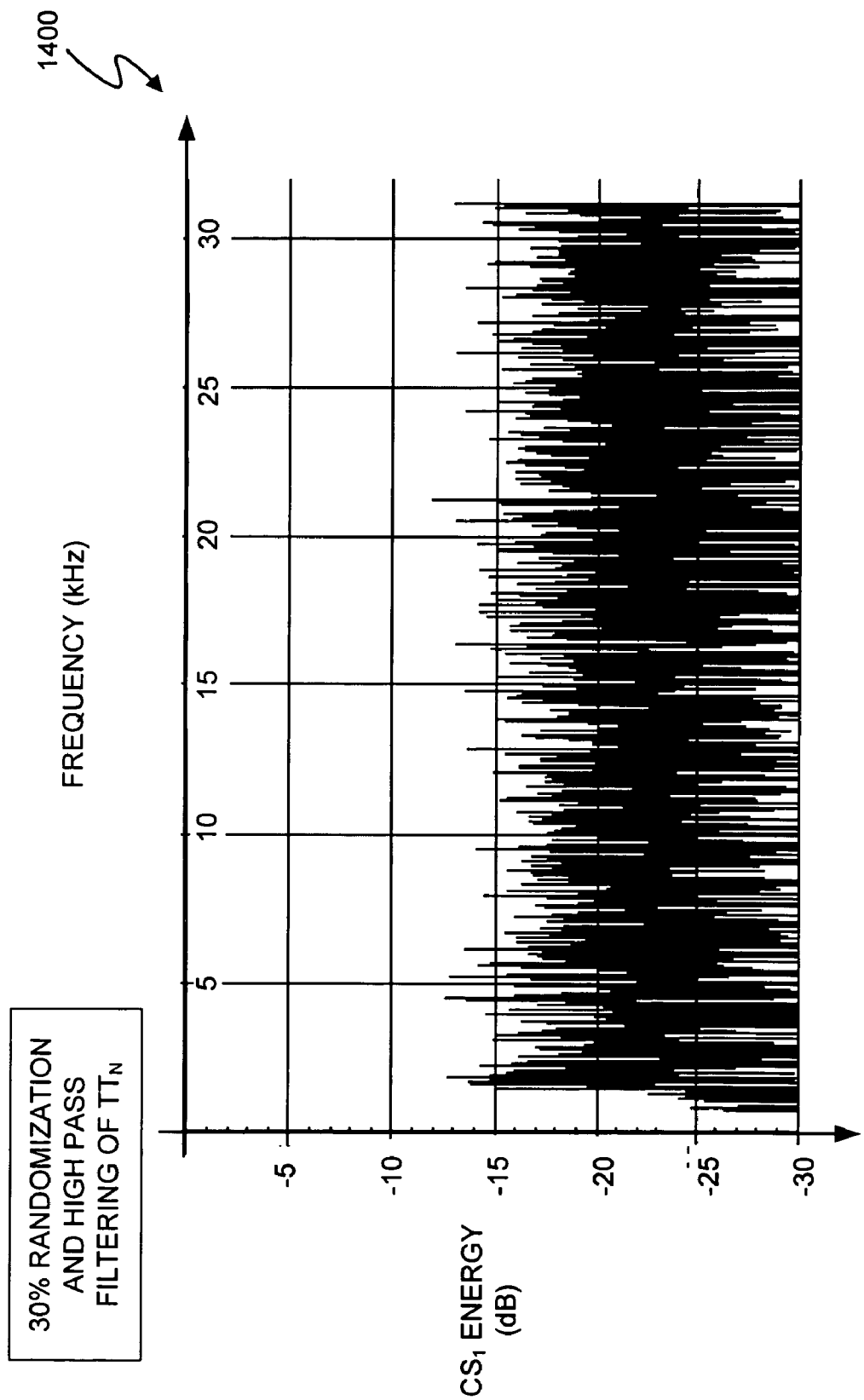

FIG. 14 also depicts a frequency versus switch control signal $CS_1$ energy graph 1400 for randomized periods $TT_R$'s of multiple determined periods $TT_N$'s of switch control signal $CS_1$. The spectrum of switch control signal $CS_1$ is broadened in graph 1400 using strategy module 600 and a high pass filter 604. In this embodiment, the high pass filter 604 has a transfer function of $(1-z^{-1})/(1-0.99\ z^{-1})$. The graph 1400 demonstrates an approximately 12 dB decrease of peak energy levels relative to the peak energy levels of graph 1300. The lower peak energy levels result in lower energy sound caused by switch control signal $CS_1$.

Figure 15:
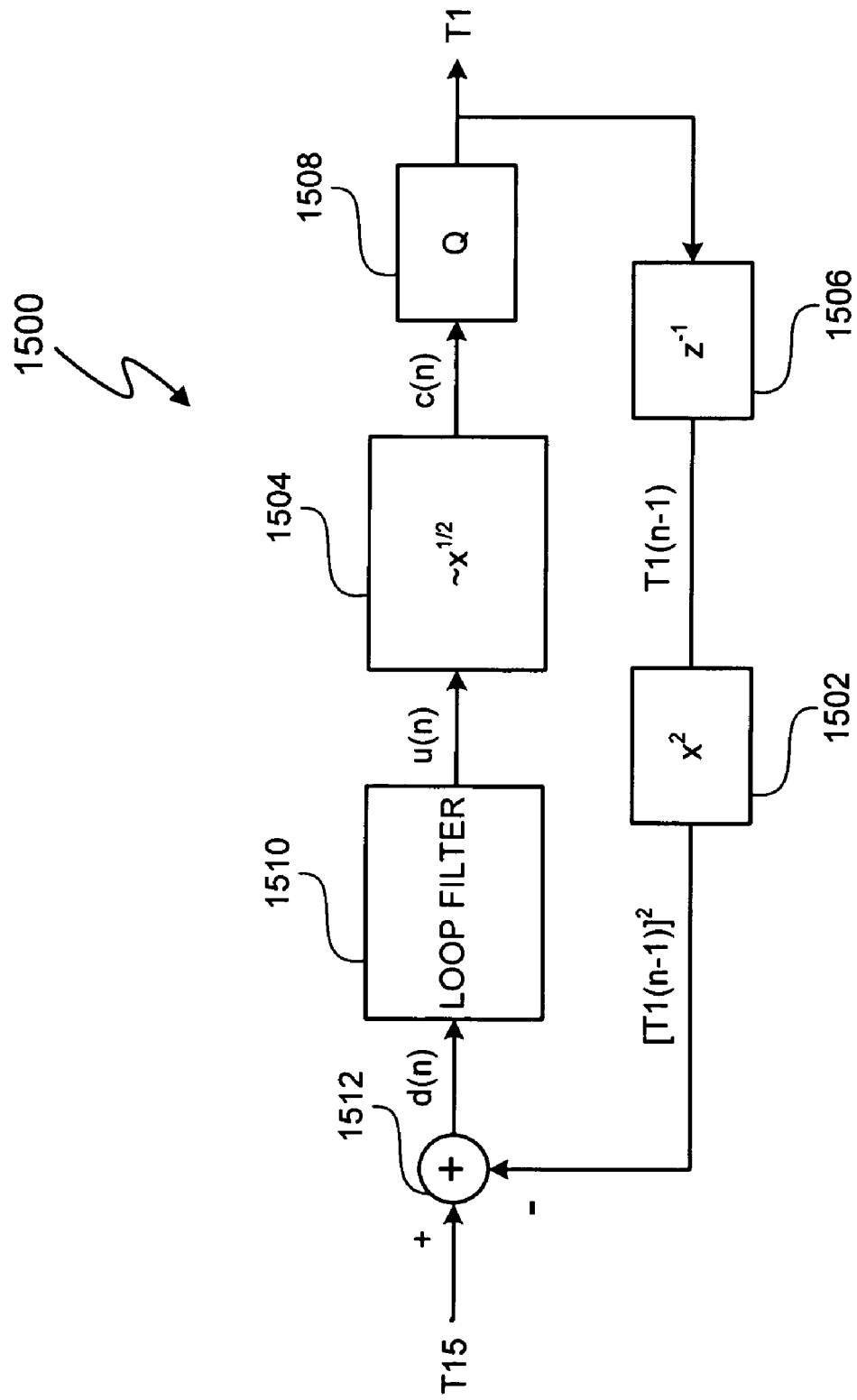
FIG. 15 depicts nonlinear delta-sigma modulator.

FIG. 15 depicts nonlinear delta-sigma modulator 1500, which represents one embodiment of nonlinear delta-sigma modulator 412. The nonlinear delta-sigma modulator 1500 models a nonlinear power transfer process of switching power converter 302. The nonlinear power transfer process of switching power converter 302 can be modeled as a square function, $x^2$. Nonlinear delta-sigma modulator 1500 includes a nonlinear system feedback model 1502 represented by $x^2$. The output of feedback model 1502 is the square of delay-by-one quantizer output signal T1, i.e. $[T1(n-1)]^2$. Delay $z^{-1}$ 1506 represents a delay-by-one of quantizer output signal T1. Negative $[T1(n-1)]^2$ is added to $T1^2$ by adder 1512. The nonlinear delta-sigma modulator 1500 includes a compensation module 1504 that is separate from quantizer 1508. The nonlinearity compensation module 1504 processes output signal u(n) of the loop filter 1510 with a square root function $x^{1/2}$ to compensate for nonlinearities introduced by the nonlinear feedback model 1502. The output c(n) of compensation module 1504 is quantized by quantizer 1508 to generate switch control signal $CS_1$ pulse width T1.

Figure 16:
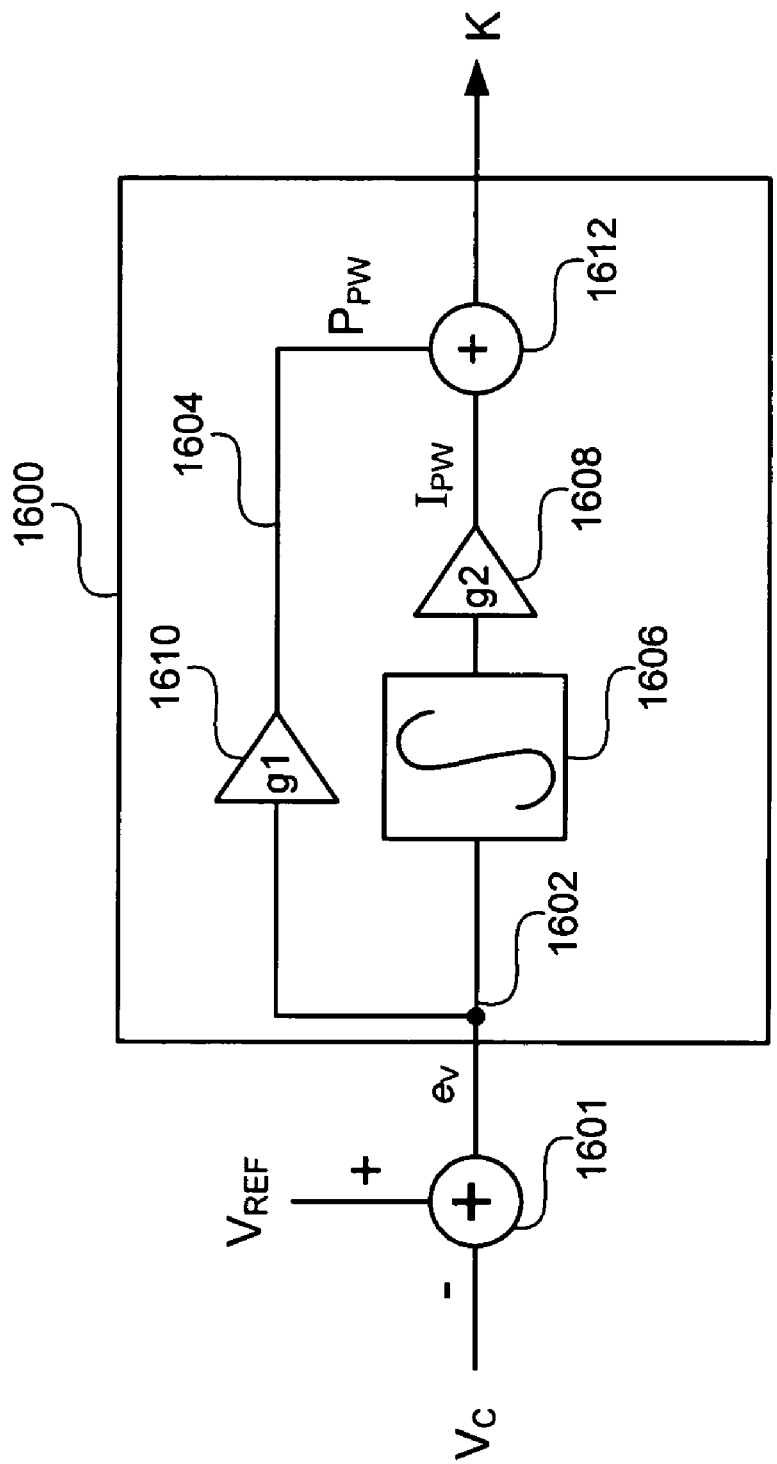
FIG. 16 depicts a proportional integrator.

FIG. 16 depicts a proportional integrator (PI) compensator 1600, which represents one embodiment of load power demand estimator 403. The PI compensator 1600 generates the load power demand signal K. The load power demand signal K varies as the difference between a reference voltage $V_{REF}$ and the output voltage $V_C$, as represented by error signal $e_v$ from error generator 1601, varies. The reference signal $V_{REF}$ is set to a desired value of output voltage $V_C$. The PI compensator 1600 includes an integral signal path 1602 and a proportional signal path 1604. The integral signal path includes an integrator 1606 to integrate the error signal $e_v$, and a gain module 1608 to multiply the integral of error signal $e_v$ by a gain factor g2 and generate the integrated output signal $I_{PW}$. The proportional path 1604 includes a gain module 1610 to multiply the error signal $e_v$ by a gain factor g1 and generate the proportional output signal $P_{PW}$. Adder 1612 adds the integrated output signal $I_{PW}$ and the proportional output signal $P_{PW}$ to generate the load power demand signal K.

The values of gain factors g1 and g2 are a matter of design choice. The gain factors g1 and g2 affect the responsiveness of switch mode controller 306. Exemplary values of gain factors g1 and g2 are set forth in the emulation code of FIGS. 8-31 of U.S. patent application Ser. No. 11/967,269, entitled "Power Control System Using a Nonlinear Delta-Sigma Modulator with Nonlinear Power Conversion Process Modeling", filed Dec. 31, 2007, assignee Cirrus Logic, Inc., and inventor John L. Melanson. U.S. patent application Ser. No. 11/967,269 describes exemplary systems and methods and is incorporated herein by reference in its entirety. Faster response times of the switch mode controller 306 allow the switch control signal $CS_1$ to more rapidly adjust to minimize the error signal $e_v$. If the response is too slow, then the output voltage $V_C$ may fail to track changes in power demand of load 112 and, thus, fail to maintain an approximately constant value. If the response is too fast, then the output voltage $V_C$ may react to minor, brief fluctuations in the power demand of load 112. Such fast reactions could cause oscillations in switch mode controller 306, damage or reduce the longevity of components, or both. The particular rate of response by proportional integrator 1600 is a design choice.

Figure 17:
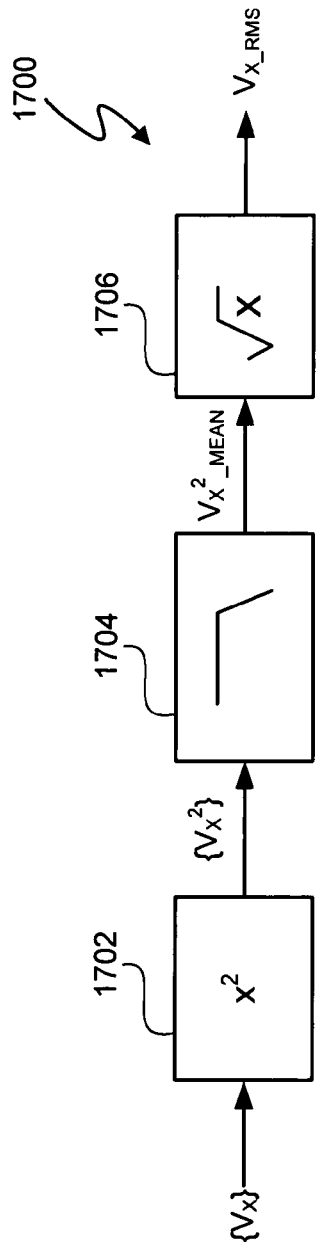
FIGS. 17 and 18 depict respective root mean square value generators.
Figure 18:
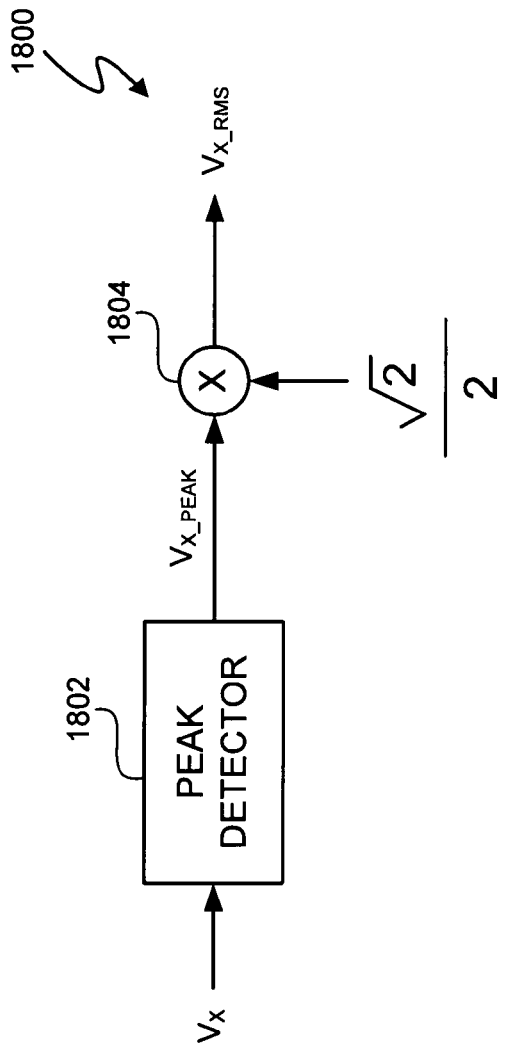

FIGS. 17 and 18 depict respective exemplary embodiments of RMS value generator 404. The RMS value of primary supply voltage $V_X$ is the square root of the average of the squares of primary supply voltage $V_X$. RMS value generator 1700 receives a set $\{V_X\}$ samples of primary supply voltage $V_X$ during a cycle of primary supply voltage $V_X$ and squaring module 1702 squares each sample of primary supply voltage to determine a set $\{V_X^2\}$. Low pass filter 1704 determines a mean $V_{X\_MEAN}^2$ of the set $\{V_X^2\}$. Square root module 1706 determines the square root of $V_{X\_MEAN}^2$ to determine the primary supply RMS voltage $V_{X\_RMS}$.

The RMS value generator 1800 receives the primary supply voltage $V_X$ and peak detector 1802 determines a peak value $V_{X\_PEAK}$ of primary supply voltage $V_X$. Since primary supply voltage $V_X$ is a sine wave in at least one embodiment, multiplying $V_{X\_PEAK}$ by $\sqrt{2}/2$ with multiplier 1804 generates primary supply RMS voltage $V_{X\_RMS}$. In at least one embodiment, as the exact value of $V_{X\_PEAK}$ is not critical, the determination of $V_{X\_PEAK}$ by RMS value generator 1800 is generally adequate.

Thus, generating a switch control signal with a broad frequency spectrum in the audible frequency band allows the power control system 300 to utilize switching frequencies in the audible frequency band that have relatively low power at any particular frequency and, in at least one embodiment, tones are also avoided.

Although the present invention has been described in detail, it should be understood that various changes, substitutions and alterations can be made hereto without departing from the spirit and scope of the invention as defined by the appended claims.

What is claimed is:

1. A system comprising:
a switch mode controller to generate a switch control signal to control conductivity of a switching mode switch included in a switching power converter, wherein the switch mode controller comprises:
a period generator to determine a nominal period of the switch control signal, recognize when the nominal period corresponds with a frequency in at least a portion of an audible frequency band, and to vary the nominal period to generate a broad frequency spectrum of the switch control signal when the nominal period corresponds with a frequency in at least a portion of an audible frequency band.

2. The system of claim 1 wherein the period generator is further configured to generate a broad frequency spectrum of the switch control signal having randomly selected periods.

3. The system of claim 1 wherein an average of the randomly selected periods approximately equals the nominal period.

4. The system of claim 1 wherein the period generator further comprises a pseudo random number generator to generate pseudorandom numbers, and the period generator is further configured to generate a broad frequency spectrum of the switch control signal having randomly selected periods based on the pseudorandom numbers.

5. The system of claim 1 wherein the period generator is further configured to generate the broad frequency spectrum of the switch control signal using periods determined using low pass filtered, pseudo random numbers.

6. The system of claim 1 wherein the period generator is further configured to generate the broad frequency spectrum of the switch control signal using periods determined using high pass filtered, pseudo random numbers.

7. The system of claim 1 wherein the period generator is further configured to generate the broad frequency spectrum of the switch control signal using delta-sigma modulated, randomized values of the nominal period.

8. The system of claim 1 wherein the audible frequency band is approximately 20 Hz to 20 kHz.

9. The system of claim 1 wherein the switch mode controller is further configured to control conductivity of the switch mode switch to cause an input current to the switching power converter to vary in approximate proportion to a time varying voltage source signal supplied to the switching power converter, wherein the switch mode controller further comprises:
a pulse width generator to determine a pulse width of the switch control signal in response to (i) the nominal period of the switch control signal, (ii) a voltage level of the voltage source signal, and (iii) a voltage level of the output voltage signal of the switching power converter.

10. A method comprising:
generating a switch control signal to control conductivity of a switch mode switch included in a switching power converter;
determining a nominal period of the switch control signal;
recognizing when the nominal period corresponds with a frequency in at least a portion of an audible frequency band,
varying the nominal period to generate a broad frequency spectrum of the switch control signal when the nominal period corresponds with a frequency in at least a portion of an audible frequency band;
determining a pulse width of the switch control signal; and
providing the switch control signal to the switch of the switching power converter.

11. The method of claim 10 further comprising:
controlling conductivity of the switch to cause an input current to the switching power converter to vary in approximate proportion to a time varying voltage source signal supplied to the switching power converter; and
determining a pulse width of the switch control signal further comprises determining a pulse width of the switch control signal in response to (i) the nominal period of the switch control signal, (ii) a voltage level of the voltage source signal, and (iii) a voltage level of the output voltage signal of the switching power converter.

12. The method of claim 10 wherein varying the nominal period to generate a broad frequency spectrum of the switch control signal further comprises generating a broad frequency spectrum of the switch control signal having randomly selected periods.

13. The method of claim 12 wherein an average of the randomly selected periods approximately equals the nominal period.

14. The method of claim 10 wherein varying the nominal period to generate a broad frequency spectrum of the switch control signal further comprises generating pseudorandom numbers and generating a broad frequency spectrum of the switch control signal having randomly selected periods based on the pseudorandom numbers.

15. The method of claim 10 wherein varying the nominal period to generate a broad frequency spectrum of the switch control signal further comprises generating the broad frequency spectrum of the switch control signal using periods determined using low pass filtered, pseudo random numbers.

16. The method of claim 10 wherein varying the nominal period to generate a broad frequency spectrum of the switch control signal further comprises generating the broad frequency spectrum of the switch control signal using periods determined using high pass filtered, pseudo random numbers.

17. The method of claim 10 wherein varying the nominal period to generate a broad frequency spectrum of the switch control signal further comprises generating the broad frequency spectrum of the switch control signal using delta-sigma modulated, randomized values of the nominal period.

18. The method of claim 10 wherein the audible frequency band is approximately 20 Hz to 20 kHz.

19. The method of claim 10 further comprising: controlling conductivity of the switch to cause an input current to the switching power converter to vary in approximate proportion to a time varying voltage source signal supplied to the switching power converter; and determining a pulse width of the switch control signal further comprises determining a pulse width of the switch control signal in response to (i) the nominal period of the switch control signal, (ii) a voltage level of the voltage source signal, and (iii) a voltage level of the output voltage signal of the switching power converter.

20. A power control system comprising: a switching power converter having a switch; and a switch mode controller to generate a switch control signal to control conductivity of a switching mode switch included in a switching power converter, wherein the switch mode controller comprises: a period generator to determine a nominal period of the switch control signal, recognize when the nominal period corresponds with a frequency in at least a portion of an audible frequency band, and to vary the nominal period to generate a broad frequency spectrum of the switch control signal when the nominal period corresponds with a frequency in at least a portion of an audible frequency band.

21. The power control system of claim 20 wherein the period generator is further configured to generate a broad frequency spectrum of the switch control signal having randomly selected periods.

22. The power control system of claim 20 wherein the switching power converter further includes an input node, an inductor coupled to the input node and the switch, a diode coupled to the switch and the inductor, and an output capacitor coupled to the diode.

23. The power control system of claim 20 wherein the switch mode controller is further configured to control conductivity of the switch mode switch to cause an input current to the switching power converter to vary in approximate proportion to a time varying voltage source signal supplied to the switching power converter, wherein the switch mode controller further comprises:
a pulse width generator to determine a pulse width of the switch control signal in response to (i) the nominal period of the switch control signal, (ii) a voltage level of the voltage source signal, and (iii) a voltage level of the output voltage signal of the switching power converter.

24. An apparatus comprising:
means for generating a switch control signal to control conductivity of a switch mode switch included in a switching power converter;
means for determining a nominal period of the switch control signal;
means for recognizing when the nominal period corresponds with a frequency in at least a portion of an audible frequency band,
means for varying the nominal period to generate a broad frequency spectrum of the switch control signal when the nominal period corresponds with a frequency in at least a portion of an audible frequency band;
means for determining a pulse width of the switch control signal; and
means for providing the switch control signal to the switch of the switching power converter.

25. The apparatus of claim 24 further comprising:
means for controlling conductivity of the switch to cause an input current to the switching power converter to vary in approximate proportion to a time varying voltage source signal supplied to the switching power converter; and
means for determining a pulse width of the switch control signal further comprises determining a pulse width of the switch control signal in response to (i) the nominal period of the switch control signal, (ii) a voltage level of the voltage source signal, and (iii) a voltage level of the output voltage signal of the switching power converter.

26. The system of claim 1 wherein the period generator is further configured to:
shape the broad frequency spectrum to minimize power in frequencies within particularly sensitive areas of the audible frequency band.

27. The system of claim 26 wherein the frequencies within particularly sensitive areas of the audible frequency band are from approximately 1 kHz-20 kHz.

28. The method of claim 10 further comprising:
shaping the broad frequency spectrum to minimize power in frequencies within particularly sensitive areas of the audible frequency band.

29. The method of claim 28 wherein the frequencies within particularly sensitive areas of the audible frequency band are from approximately 1 kHz-20 kHz.

30. The power control system of claim 21 wherein the period generator is further configured to:
shape the broad frequency spectrum to minimize power in frequencies within particularly sensitive areas of the audible frequency band.

31. The power control system of claim 30 wherein the frequencies within particularly sensitive areas of the audible frequency band are from approximately 1 kHz-20 kHz.

32. The apparatus of claim 1 further comprising:
means for shaping the broad frequency spectrum to minimize power in frequencies within particularly sensitive areas of the audible frequency band.

33. The apparatus of claim 32 wherein the frequencies within particularly sensitive areas of the audible frequency band are from approximately 1 kHz-20 kHz.

* * * * *